United States Patent
Lu et al.

(10) Patent No.: US 9,559,606 B2
(45) Date of Patent: Jan. 31, 2017

(54) LAYOUT OF POWER CONVERTER

(71) Applicant: DELTA ELECTRONICS, INC., Taoyuan (CN)

(72) Inventors: Juncheng Lu, Taoyuan (CN); Zeng Li, Taoyuan (CN)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 14/962,074

(22) Filed: Dec. 8, 2015

(65) Prior Publication Data
US 2016/0173000 A1  Jun. 16, 2016

(30) Foreign Application Priority Data
Dec. 12, 2014  (CN) .......................... 2014 1 0768760

(51) Int. Cl.
*H02M 7/00* (2006.01)
*H02M 7/538* (2007.01)
*H02M 7/797* (2006.01)

(52) U.S. Cl.
CPC ............. *H02M 7/003* (2013.01); *H02M 7/538* (2013.01); *H02M 7/797* (2013.01)

(58) Field of Classification Search
CPC ...... H02M 7/003; H02M 7/483; H02M 7/487; H02M 7/537; H02M 7/5387
See application file for complete search history.

(56) References Cited

U.S. PATENT DOCUMENTS

| | | | | |
|---|---|---|---|---|
| 5,512,782 A | * | 4/1996 | Kobayashi | H02M 7/003 257/691 |
| 6,031,738 A | * | 2/2000 | Lipo | H02M 7/487 363/37 |
| 6,278,264 B1 | * | 8/2001 | Burstein | H01L 23/5386 257/700 |
| 6,327,165 B1 | * | 12/2001 | Yamane | H02M 7/003 363/132 |
| 6,441,509 B1 | * | 8/2002 | Miller | B60L 11/1805 307/9.1 |
| 6,958,924 B2 | * | 10/2005 | Gateau | H02M 7/483 363/132 |
| 9,071,165 B2 | * | 6/2015 | Soua | H02M 7/487 |
| 2002/0034089 A1 | * | 3/2002 | Mori | H02M 5/4585 363/147 |
| 2002/0167825 A1 | * | 11/2002 | Okayama | H02M 7/003 363/37 |
| 2005/0127853 A1 | * | 6/2005 | Su | H02M 7/487 318/108 |

(Continued)

*Primary Examiner* — Timothy J Dole
*Assistant Examiner* — Yusef Ahmed
(74) *Attorney, Agent, or Firm* — Yunling Ren

(57) ABSTRACT

A layout of a switching power converter, wherein the switching power converter includes: a capacitor unit receiving or outputting DC voltage; six power transistor units transforming the DC voltage to the AC voltage or the AC voltage to the DC voltage; and a carrier board with the capacitor unit and the six power transistor units on. The layout of the switching power converter includes a first commutation loop and a second commutation loop, in which the six power transistor units are arranged on the same surface of the carrier board. In order to ensure the first commutation loop and the second commutation loop as short as possible, the fifth power transistor unit is located at a middle position of the carrier board, surrounded by the other five power transistor units as closely as possible.

18 Claims, 26 Drawing Sheets

(56) References Cited

U.S. PATENT DOCUMENTS

| | | | | |
|---|---|---|---|---|
| 2005/0265002 A1* | 12/2005 | Armstrong | ......... | H05K 7/20909 361/719 |
| 2007/0048574 A1* | 3/2007 | Aiello | ................ | H05K 7/20927 429/435 |
| 2007/0145580 A1* | 6/2007 | Satou | ................ | H01L 23/49575 257/723 |
| 2010/0149846 A1* | 6/2010 | Tan | ..................... | H02M 7/5387 363/132 |
| 2012/0120698 A1* | 5/2012 | Viitanen | ............... | H02M 7/487 363/126 |
| 2014/0211520 A1* | 7/2014 | Zhang | ................... | H02M 1/126 363/37 |
| 2014/0254228 A1* | 9/2014 | Ying | ................... | H02M 7/5387 363/132 |
| 2014/0268940 A1* | 9/2014 | Viitanen | ............... | H02M 7/797 363/50 |
| 2014/0362620 A1* | 12/2014 | Yoo | ....................... | H02M 7/483 363/37 |
| 2014/0369099 A1* | 12/2014 | Asako | ................... | H02M 7/003 363/97 |
| 2015/0003127 A1* | 1/2015 | Takizawa | ................ | H02M 1/32 363/50 |
| 2015/0303819 A1* | 10/2015 | Qu | ........................ | H02M 7/487 363/35 |
| 2016/0149507 A1* | 5/2016 | Lei | .......................... | H02M 1/12 363/35 |

* cited by examiner

Vout>0, Iout>0

Vout>0, Iout<0

LAYOUT OF POWER CONVERTER

CROSS REFERENCE TO RELATED APPLICATIONS

The present application is based upon and claims priority to Chinese Patent Application No. 201410768760.7, filed on Dec. 12, 2014, the entire contents of which are incorporated herein by reference.

TECHNICAL FIELD

The present disclosure relates to a layout of a power converter, and more particularly, to a layout of a switching power converter.

BACKGROUND

Currently, an inverter is typically a switching power converter constituted by semiconductor components, mainly used for converting DC (direct current) power into AC (alternative current) power or pulsating DC power.

For an inverter based on conventional full-bridge topology, in a modulation mode using bipolar PWM (pulse width modulation), switching losses are huge, thus efficiency is low. In modulation using unipolar PWM, leakage currents are large, which affects safety of systems (i.e., the switching power converters). Therefore, based on the conventional full-bridge topology, neither of the two types of modulation meets the requirements in inverter production.

To solve the above problems, an inverter with six-transistor topology is proposed.

FIG. 1 is a schematic circuit diagram of a switching power converter with six-transistor topology of the prior art. As shown in FIG. 1, the topology includes: three bridge arms in parallel, in which a first bridge arm only includes a first filter capacitor C, a second bridge arm is constituted by switch transistors S3, S6 and S4 connected in series, and diodes D3, D6 and D4 are respectively connected in antiparallel with the switch transistors S3, S6 and S4. A third bridge arm is constituted by a switch transistor S1 and a switch transistor S2 connected in series, and diodes D1 and D2 are respectively connected in antiparallel with the switch transistors S1 and S2. A switch transistor S5 is connected the common node of the switch transistor S3 and the switch transistor S6 with the common node of the switch transistor S1 and the switch transistor S2. A diode D5 is connected in antiparallel with the switch transistor S5. A filtering circuit constituted by an inductor L1, a second filter capacitor Ch and an inductor L2. The two terminals of the second filter capacitor Ch connect to two terminals of AC side of the switching power converter respectively. One terminal of the inductor L1 connects with one terminal of the AC side, the other terminal of the inductor L1 connects with the common node of the switch transistor S1 and the switch transistor S2; one terminal of the inductor L2 connects with the other terminal of AC side, the other terminal of the inductor L2 connects with the common node of the switch transistor S6 and the switch transistor S4. At DC side of the switching power converter, there is the first filter capacitor C which connects between a positive terminal DC+ and a negative terminal DC−. The second filter capacitor Ch is a high-frequency filter capacitor. Herein each switch transistor and the diode connected in antiparallel therewith are collectively referred to as a power transistor unit. In addition, to make the description easy, it is assumed that an output voltage Vout or an output current Iout of the AC side Vac has a positive direction as indicated by arrows in FIG. 1, that is, the switching power converter serves as an inverter.

The switching power converter with six-transistor topology shown in FIG. 1 may solve the problems of the high switching losses in bipolar PWM modulation and the large leakage current in unipolar PWM modulation, moreover, the topology shown in FIG. 1 may also operate in a rectifier mode under certain circumstances. Since the switching power converter with six-transistor topology shown in FIG. 1 is a switch circuit, and constituted by semiconductor switch components such as MOSFETs (metal-oxide-layer semiconductor field effect transistors), IGBTs (insulated gate bipolar transistors) and diodes, in which the switch components operate at high frequencies in a switching mode (particularly when the switch components shown in FIG. 1 operate alternately), energy stored in parasitic inductance in commutation loops will be dissipated on the circuits during switching, and meanwhile, voltage spikes across the components will be increased due to the circuit parasitic parameters, which may reduce reliability of the system. That is to say, in the switching power converter, large circuit parasitic inductance may result in undesirable electrical characteristics of the switch circuit thereof. Therefore, a layout of the components in the switch circuit of the switching power converter needs to be optimized.

In addition, as users desire for electronic products with thin, small sizes and other properties, switching frequencies for the switch circuit of the switching power converter tend to be increased. Moreover, with the development of semiconductor components, new types of semiconductor components such as silicon carbide components and gallium nitride components emerge, which have even higher operating frequencies and lower conduction losses. Therefore, in the future, switching power converter products require the circuit parasitic inductance to be even smaller.

SUMMARY

A first aspect of the present disclosure is to provide a layout of a power converter, wherein the power converter includes:

six power transistor units, including: a first power transistor unit, a second power transistor unit, a third power transistor unit, a fourth power transistor unit, a fifth power transistor unit and a sixth power transistor unit, wherein the first power transistor unit and the second power transistor unit are connected in series to form a first bridge arm, the third power transistor unit, the sixth power transistor unit and the fourth power transistor unit are connected sequentially in series to form a second bridge arm, the first bridge arm and the second bridge arm are connected in parallel, a common node of the first power transistor unit and the second power transistor unit is a midpoint of the first bridge arm, an end of the fifth power transistor unit is connected to the midpoint of the first bridge arm, and another end of the fifth power transistor unit is connected to a common node of the third power transistor unit and the sixth power transistor unit;

a capacitor unit, wherein an end of the capacitor unit is connected to a common node of the first power transistor unit and the third power transistor unit, and another end of the capacitor unit is connected to a common node of the second power transistor unit and the fourth power transistor unit; and a carrier board, wherein a surface of the carrier board carries the six power transistor units and the capacitor unit and the carrier board provides electrical connections between the six power transistor units and the capacitor unit, and edges of the carrier board are provided with pins for the power converter to be electrically connected to outside, wherein a first commutation circuit is formed by the capacitor unit, the first power transistor unit, the fifth power transistor unit, the sixth power transistor unit, the fourth power transistor unit in turn, a second commutation circuit is formed by the capacitor unit, the second power transistor unit, the fifth power transistor unit and the third power transistor unit in turn, and wherein the fifth power transistor unit is located at a middle position of the surface of the carrier board, and a connection line segment from the fourth power transistor unit to the first power transistor unit and a connection line segment from the fourth power transistor unit to the sixth power transistor unit do not overlap with a connection line segment from the second power transistor unit to the third power transistor unit.

A second aspect of the present disclosure is to provide another layout of a power converter, wherein the power converter includes:

six power transistor units, including: a first power transistor unit, a second power transistor unit, a third power transistor unit, a fourth power transistor unit, a fifth power transistor unit and a sixth power transistor unit, wherein the first power transistor unit and the second power transistor unit are connected in series to form a first bridge arm, the third power transistor unit, the sixth power transistor unit and the fourth power transistor unit are connected sequentially in series to form a second bridge arm, the first bridge arm and the second bridge arm are connected in parallel, a common node of the first power transistor unit and the second power transistor unit is a midpoint of the first bridge arm, an end of the fifth power transistor unit is connected to the midpoint of the first bridge arm, and another end of the fifth power transistor unit is connected to a common node of the third power transistor unit and the sixth power transistor unit;

a capacitor unit, wherein an end of the capacitor unit is connected to a common node of the first power transistor unit and the third power transistor unit, and another end of the capacitor unit is connected to a common node of the second power transistor unit and the fourth power transistor unit; and a carrier board, wherein a surface of the carrier board carries the six power transistor units and the capacitor unit and the carrier board provides electrical connections between the six power transistor units and the capacitor unit, and edges of the carrier board is provided with pins for the power converter to be electrically connected to outside, wherein a first commutation circuit is formed by the capacitor unit, the first power transistor unit, the fifth power transistor unit, the sixth power transistor unit and the fourth power transistor unit in turn, a second commutation circuit is formed by the capacitor unit, the second power transistor unit, the fifth power transistor unit and the third power transistor unit in turn, and wherein the fifth power transistor unit is located at a middle position of the surface of the carrier board, and a sum of a length of a connection line segment from the fourth power transistor unit to the first power transistor unit, a length of a connection line segment from the fourth power transistor unit to the sixth power transistor unit and a length of a connection line segment between the second power transistor unit and the third power transistor unit is less than or equal to 66 mm.

According to the layout method of the power converter of the aspects of the present disclosure, the switching power converter with six-transistor topology may have smaller parasitic inductance of the commutation loop, thereby the electrical characteristic of the switching power converter is improved, such that efficiency and power density of the switching power converter and enhance reliability of the system are improved.

BRIEF DESCRIPTION OF THE DRAWINGS

The above and other features and advantages of the present disclosure will become more apparent from the detailed description with reference to accompanying drawings, in which.

DETAILED DESCRIPTION

Figure 1:
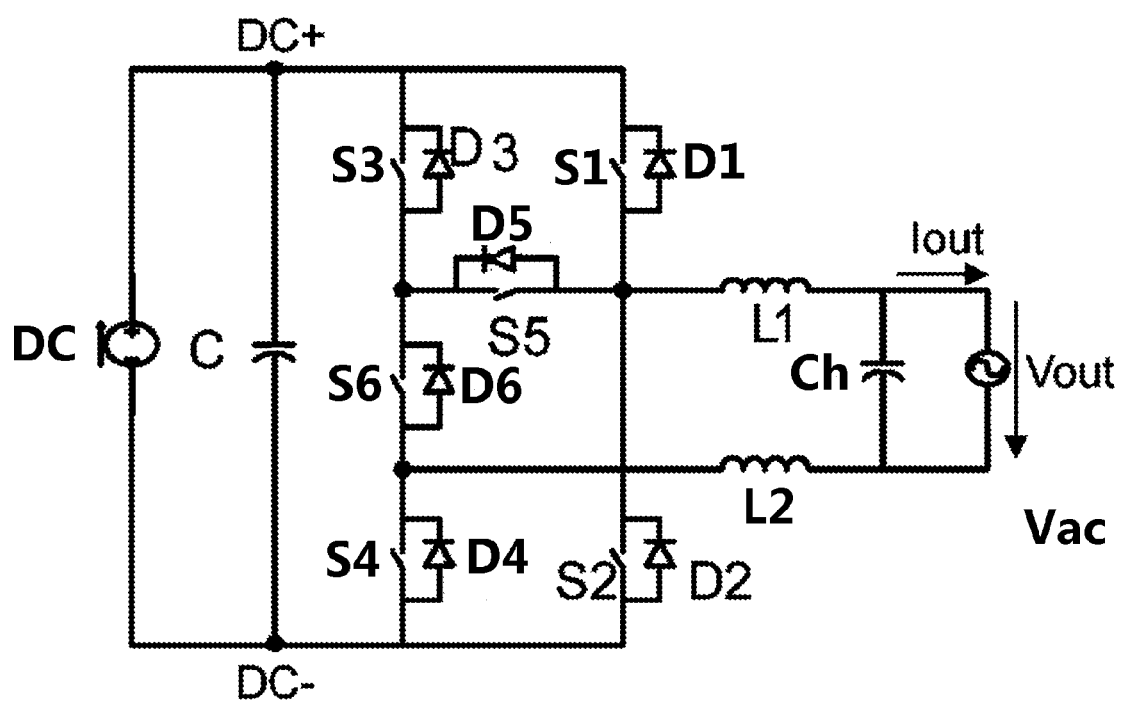
FIG. 1 is a schematic circuit diagram of a switching power converter with six-transistor topology of the prior art.

Hereinafter, the present disclosure will be described in details with reference to FIGS. 1-23, in which same reference numerals denote same or like devices or signals.

To understand the present disclosure easily, firstly, inductance of prior art about a layout of the switching power converter is described.

Figure 2:
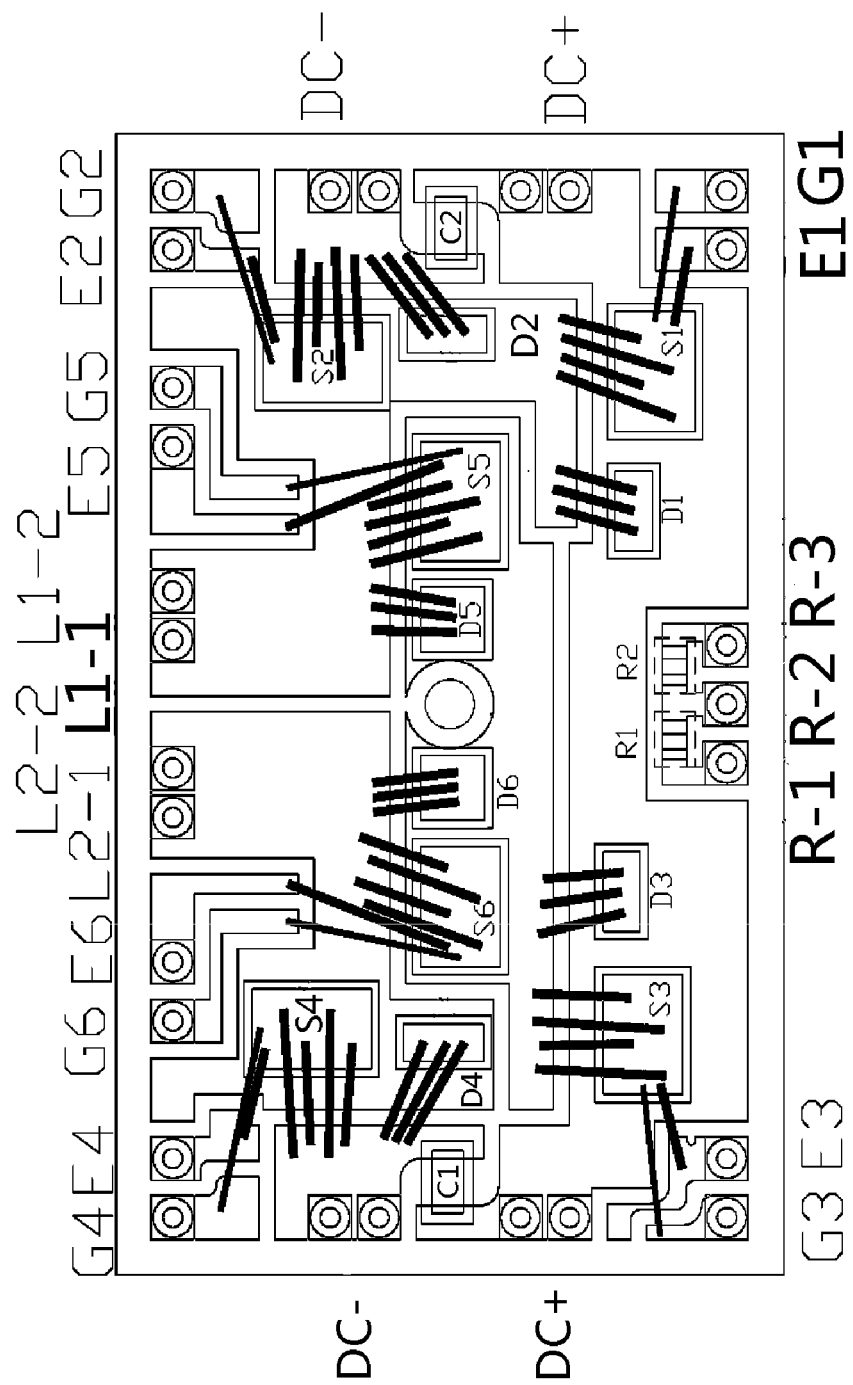
FIG. 2 is a prior art of a layout of the switching power converter with six-transistor topology shown in FIG. 1.

FIG. 2 is a prior art of a layout of a 5 kW switching power converter with six-transistor topology shown in FIG. 1. As shown in FIG. 2, in the topology, a first filter capacitor C specifically includes filter capacitors C1 and C2 in the switching power converter, connected in parallel. The capacitors and the semiconductor chips are soldered to a carrier board such as a DBC (direct bonded copper) ceramic substrate and connected via wire bonding and copper layer of the DBC. Here, in FIG. 2, thick solid line segments represent bonding wires, and closed figures surrounded by thin solid line segments represent plated copper. In addition, in the layout of the switching power converter including the capacitors and the semiconductor chips in the six-transistor topology shown in FIG. 2, two resistors R1 and R2 connected in series are also integrated, which are led out by three pins.

In the layout of the switching power converter shown in FIG. 2, the components include, from one side to the other side, switch transistors S4 and S2 located sequentially in the first row, a filter capacitor C1, a diode D4, a switch transistor S6, diodes D6 and D5, a switch transistor S5, a diode D2 and a filter capacitor C2 located sequentially in the second row, and a switch transistor S3, a diode D3, resistors R1 and R2, a diode D1 and a switch transistor S1 located sequentially in the third row.

At edges of the carrier board shown in FIG. 2, multiple pins are distributed around edges thereof. Starting from the top left corner of the carrier board, in a clockwise direction, the pins are respectively pins G4 and E4 of the switch transistor S4, pins G6 and E6 of the switch transistor S6, two pins L2-1 and L2-2 of an inductor L2, two pins L1-1 and L1-2 of an inductor L1, pins E5 and G5 of the switch transistor S5, pins E2 and G2 of the switch transistor S2, two negative terminals DC− and two positive terminals DC+ of the DC side, pins G1 and E1 of the switch transistor S1, pins R-3, R-2 and R-1 of internally integrated resistors R2 and R1, pins E3 and G3 of the switch transistor S3, two positive terminals DC+ and two negative terminals DC− of the DC side.

Although electrical characteristics of the switching power converter shown in FIG. 2 is considerably improved compared to the traditional switching power converter composed by discrete components, it still has significantly high energy losses and voltage spikes across components due to the parasitic inductance in high frequency applications.

One aspect of the present disclosure may optimize the layout of the switching power converter to achieve lower power losses and the voltage spikes caused by the parasitic inductance.

To understand the rule of layout optimization of present disclosure easily, it is necessary to analyze the operation processes of the six-transistor topology circuit first. Detail analysis will be described in the following.

Figure 3:
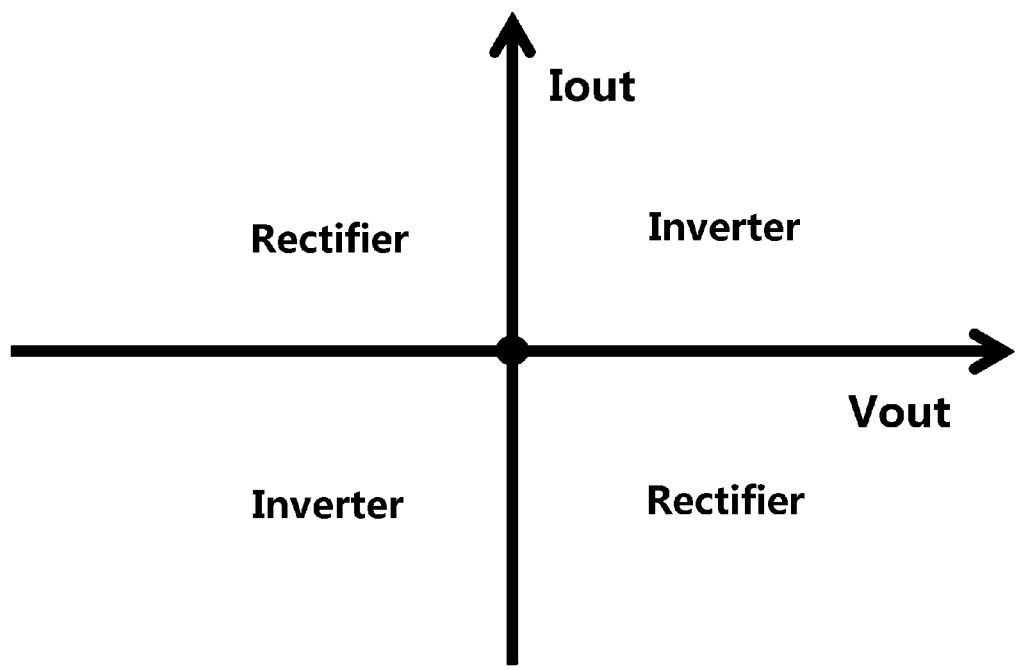
FIG. 3 is a Mode-Quadrant diagram of the six-transistor topology circuit shown in FIG. 1.

FIG. 3 is a Mode-Quadrant diagram of the switching power converter shown in FIG. 1. As shown in FIG. 3, when the circuit operates in the first or third quadrant, the circuit is in an inverter mode, and may output AC or pulsating DC power to outside through the AC side Vac, as an inverter. When the circuit operates in the second or fourth quadrant, the circuit is in a rectifier mode, and may absorb AC or pulsating DC power, or in other words, output DC power to outside through the DC side, as a rectifier.

When the switching power converter shown in FIG. 1 operates in an inverter mode, for example, when the circuit operates in the first quadrant, a driving signal of the switch transistor S5 may be constantly at a high voltage level, driving signals of the switch transistors S2, S3 and S6 may be constantly at a low voltage level, and one switching cycle includes the following four processes.

Figure 4:
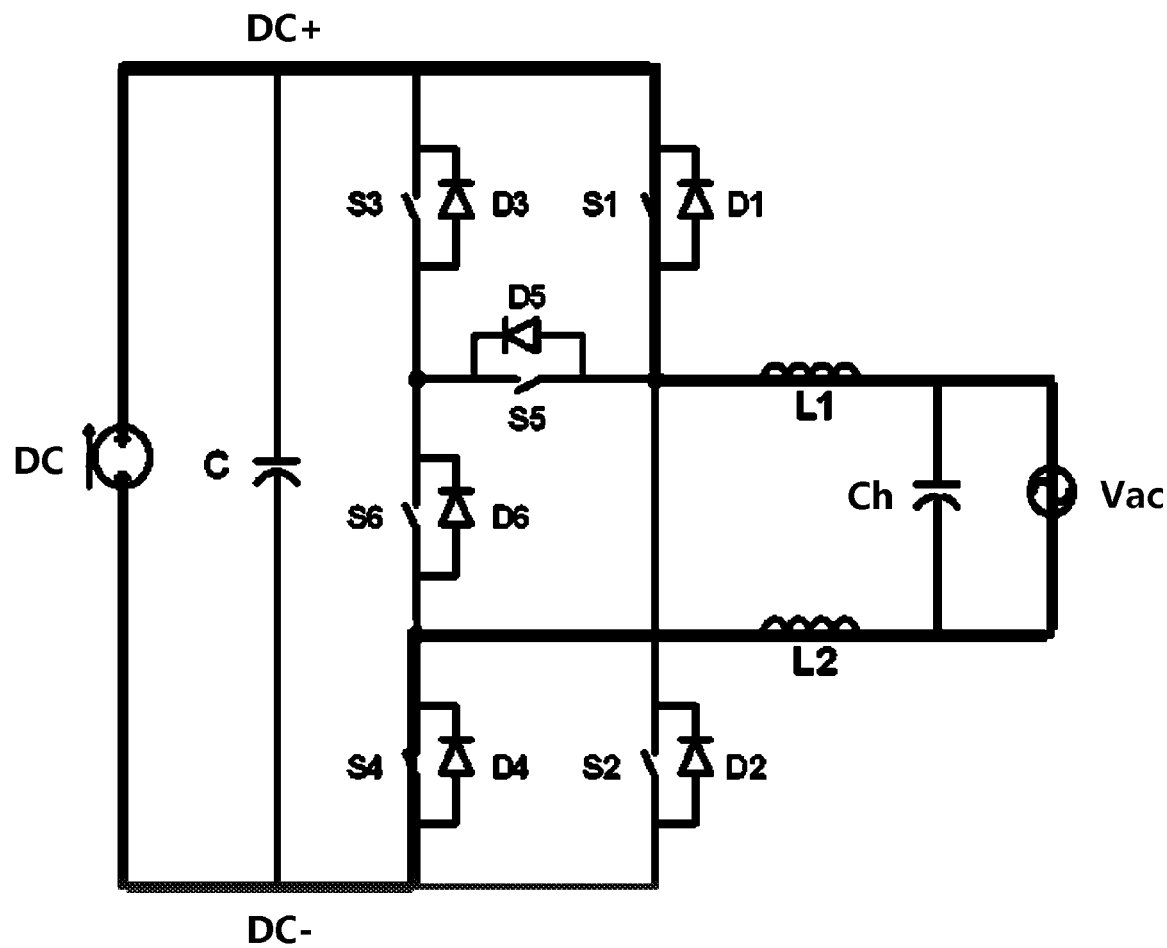
FIG. 4 is a schematic view illustrating a first process in which the six-transistor topology circuit shown in FIG. 1 operates in an inverter mode.

FIG. 4 is a schematic view illustrating a first process, i.e., from t0 to t1 of the time, when the switching power converter shown in FIG. 1 operates in an inverter mode. Driving signals of the switch transistors S1 and S4 are constantly at a high voltage level, and the switch transistors S1 and S4 are turned on. As indicated by thick solid line segments, a current flows through the positive terminal DC+ of the DC side, the switch transistor S1, the inductor L1, a load (not shown, herein equivalent to AC or pulsating DC power output from the AC side Vac), the inductor L2, the switch transistor S4 and the negative terminal DC− of the DC side.

Figure 5:
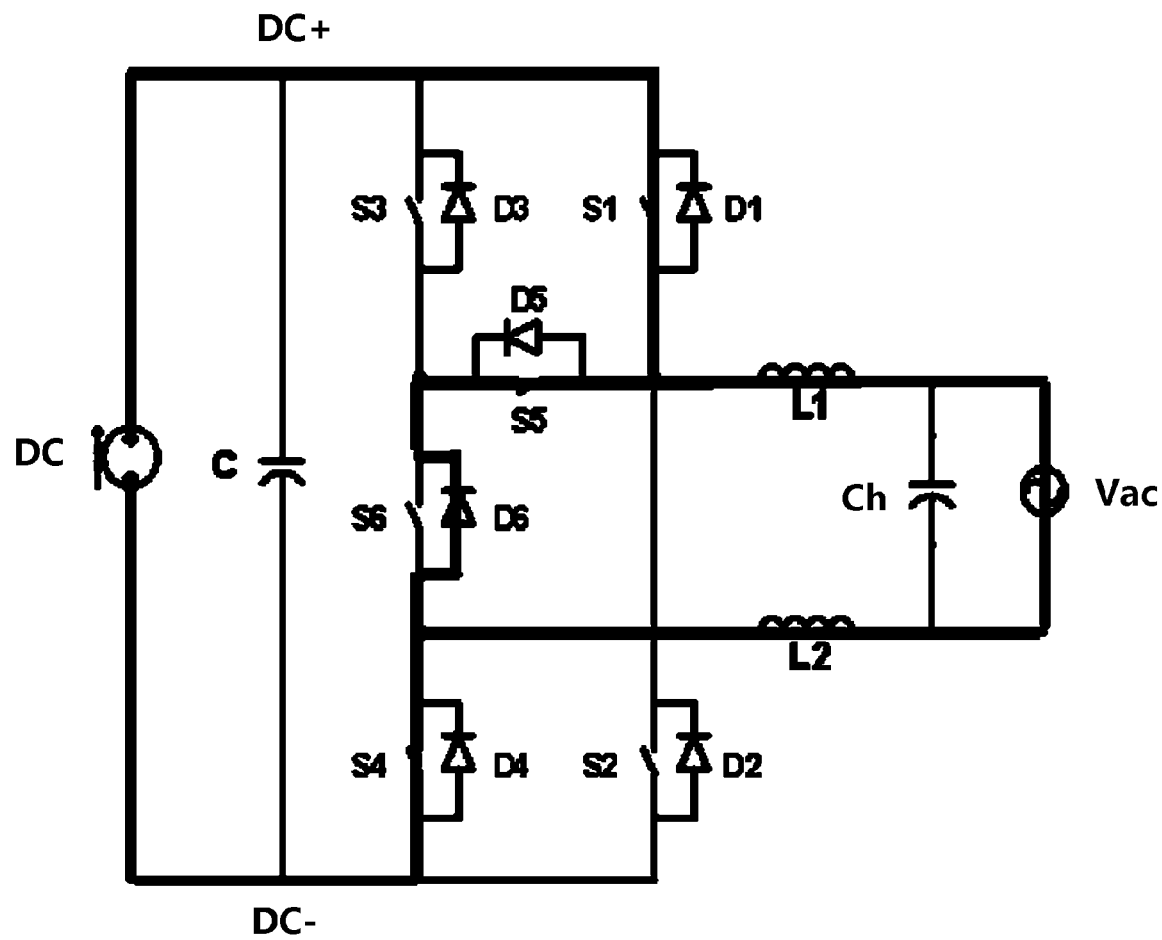
FIG. 5 is a schematic view illustrating a second process in which the six-transistor topology circuit shown in FIG. 1 operates in an inverter mode.

FIG. 5 is a schematic view illustrating a second process, i.e., from t1 to t2 of the time, when the switching power converter shown in FIG. 1 operates in the inverter mode. The driving signals of the switch transistors S1 and S4 are changed to a low voltage level from the high voltage level, and the switch transistors S1 and S4 are going to be turned off. As indicated by thick solid line segments, the current begins to flow through the diodes D6 and the switch transistor S5. During this process, the current in the branch of the switch transistors S1 and S4 is rapidly decreased. Meanwhile the current in the branch of the diodes D6 and the switch transistor S5 is rapidly increased. Thereby, a high frequency current is equivalently generated, which flows sequentially through the positive terminal DC+ of the DC side, the switch transistors S1 and S5, the diode D6, the switch transistor S4 and the negative terminal DC− of the DC side. This process is a transient process from a turned-on state to a turned-off state of the switch transistors S1 and S4, taking a time period as short as that in microsecond level or even that in nanosecond level.

Figure 6:
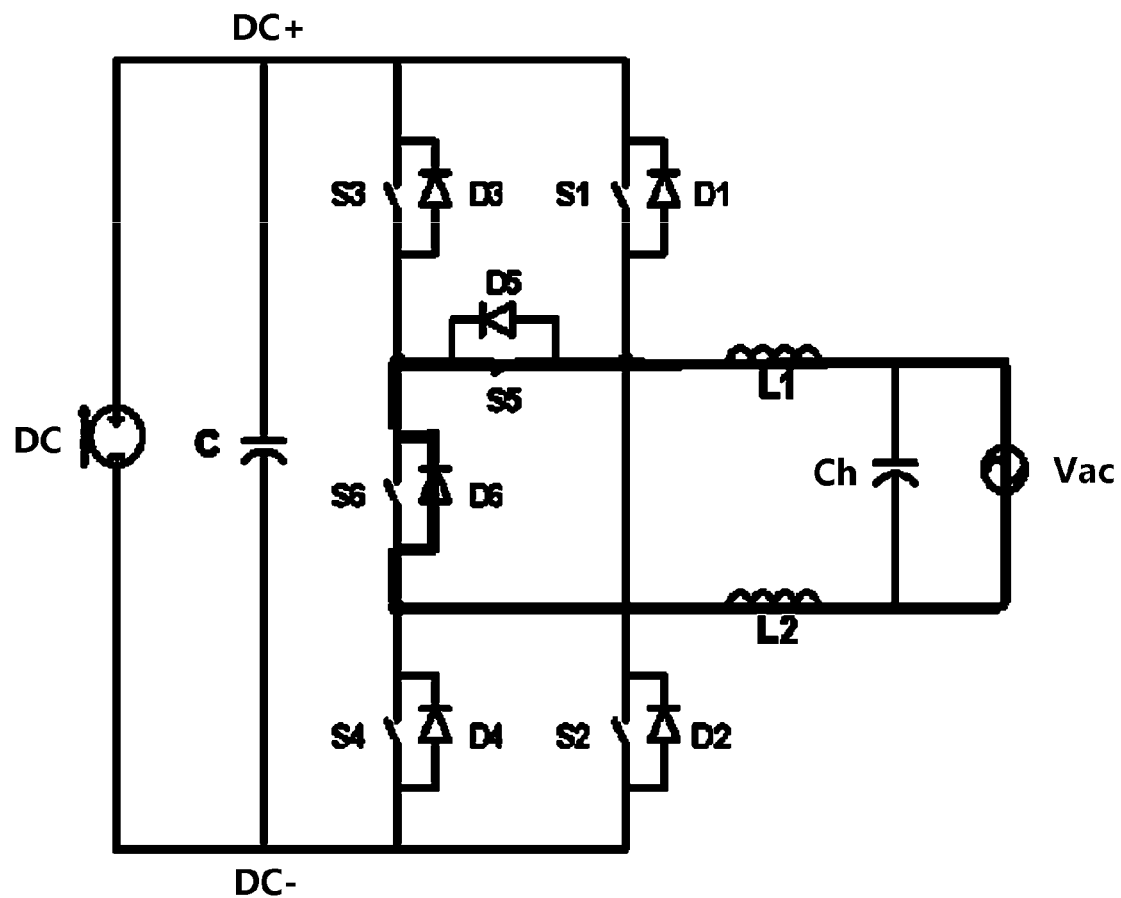
FIG. 6 is a schematic view illustrating a third process in which the six-transistor topology circuit shown in FIG. 1 operates in an inverter mode.

FIG. 6 is a schematic view illustrating a third process, i.e., from t2 to t3 of the time, when the switching power converter shown in FIG. 1 operates in the inverter mode. The driving signals of the switch transistors S1 and S4 are at the low voltage level, and the switch transistors S1 and S4 have been turned off. The switch transistor S5 is turned on and the diode D6 is in an on state. As indicated by thick solid line segments, the current flows through the diode D6, the switch transistor S5, the inductor L1, the load and the inductor L2.

Figure 7:
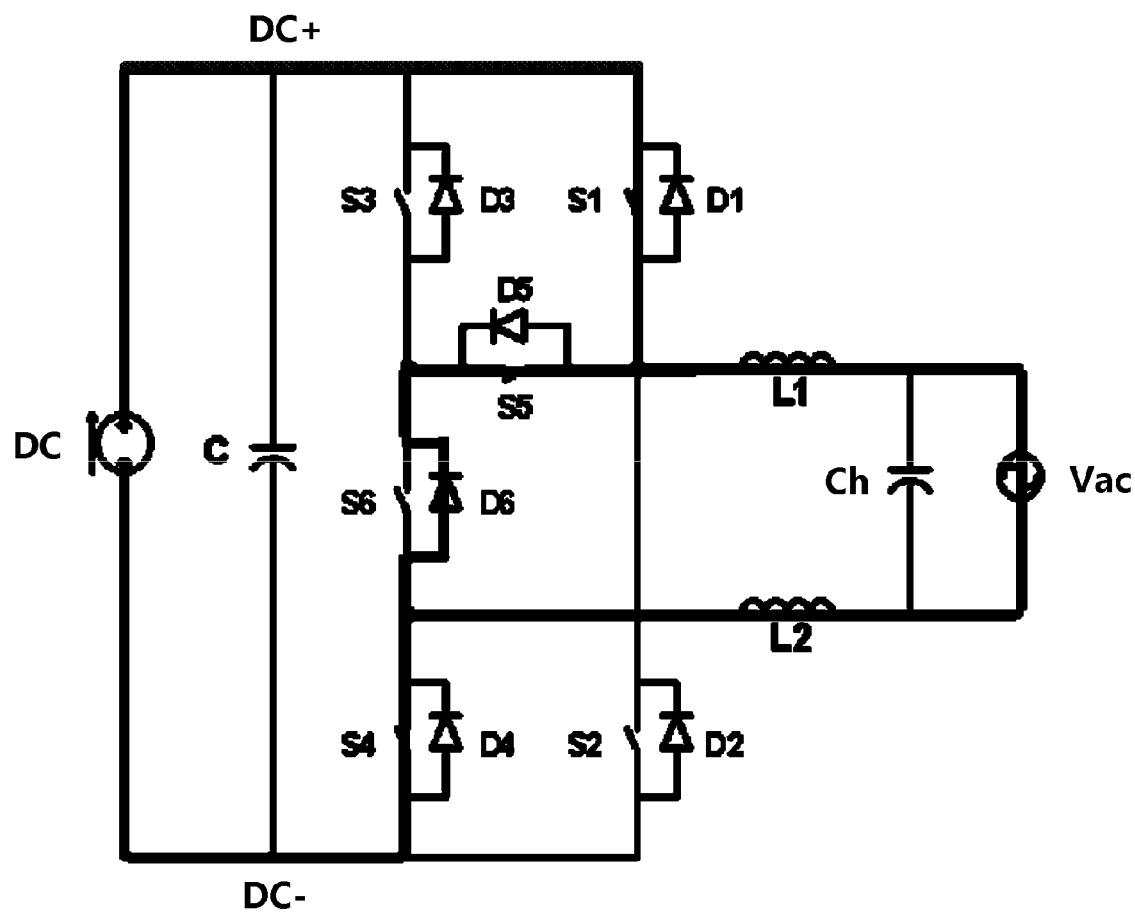
FIG. 7 is a schematic view illustrating a fourth process in which the six-transistor topology circuit shown in FIG. 1 operates in an inverter mode.

FIG. 7 is a schematic view illustrating a fourth process, i.e., from t3 to t4 of the time, when the switching power converter shown in FIG. 1 operates in the inverter mode. The driving signals of the switch transistors S1 and S4 are changed to the high voltage level from the low voltage level, and the switch transistors S1 and S4 are going to be turned on. As indicated by thick solid line segments, the current begins to flow through the switch transistors S1 and S4. During this process, the current in the branch of the diode D6 and the switch transistor S5 is rapidly decreased. Meanwhile the current in the branch of the switch transistors S1 and S4 is rapidly increased. Similarly, a high frequency current is equivalently generated, which flows sequentially through the positive terminal DC+ of the DC side, the switch transistors S1 and S5, the diode D6, the switch transistor S4 and the negative terminal DC− of the DC side. This process is a transient process from the turned-off state to the turned-on state of the switch transistors S1 and S4, taking a time period as short as that in microsecond level or even that in nanosecond level.

In addition, when the switching power converter shown in FIG. 1 operates in a rectifier mode, for example, when the circuit operates in the second quadrant, the driving signals of the switch transistors S1, S2, S3, S4 and S5 may be constantly at the low voltage level, and one switching cycle includes the following four processes.

Figure 8:
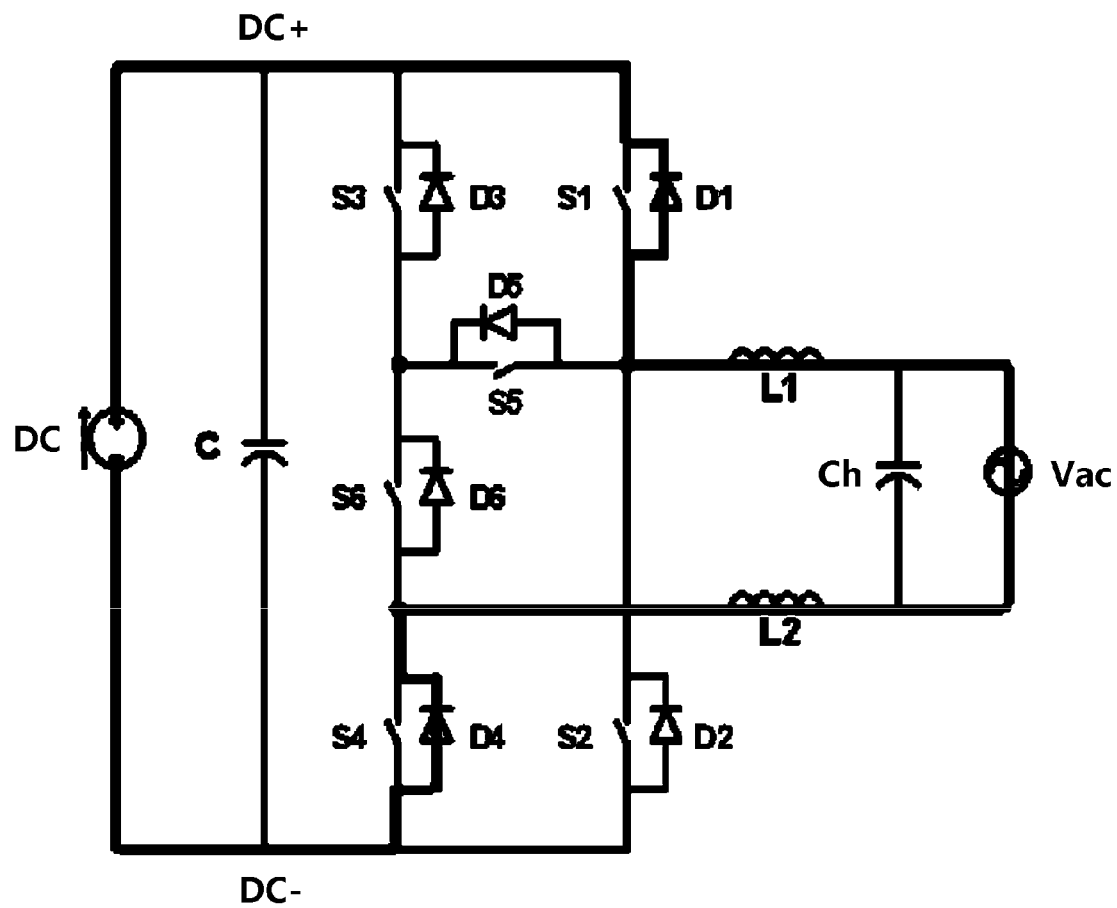
FIG. 8 is a schematic view illustrating a first process in which the six-transistor topology circuit shown in FIG. 1 operates in a rectifier mode.

FIG. 8 is a schematic view illustrating a first process, i.e., from t'0 to t'1 of the time, when the switching power converter shown in FIG. 1 operates in a rectifier mode (or a boost mode). The driving signal of the switch transistor S6 is at the low voltage level, and the diodes D1 and D4 transform to an on state. As indicated by thick solid line segments, the current flows through the AC side Vac, the inductor L1, the diode D1, a load (not shown, herein equivalent to DC or pulsating DC power output from the DC side), the diode D4 and the inductor L2.

Figure 9:
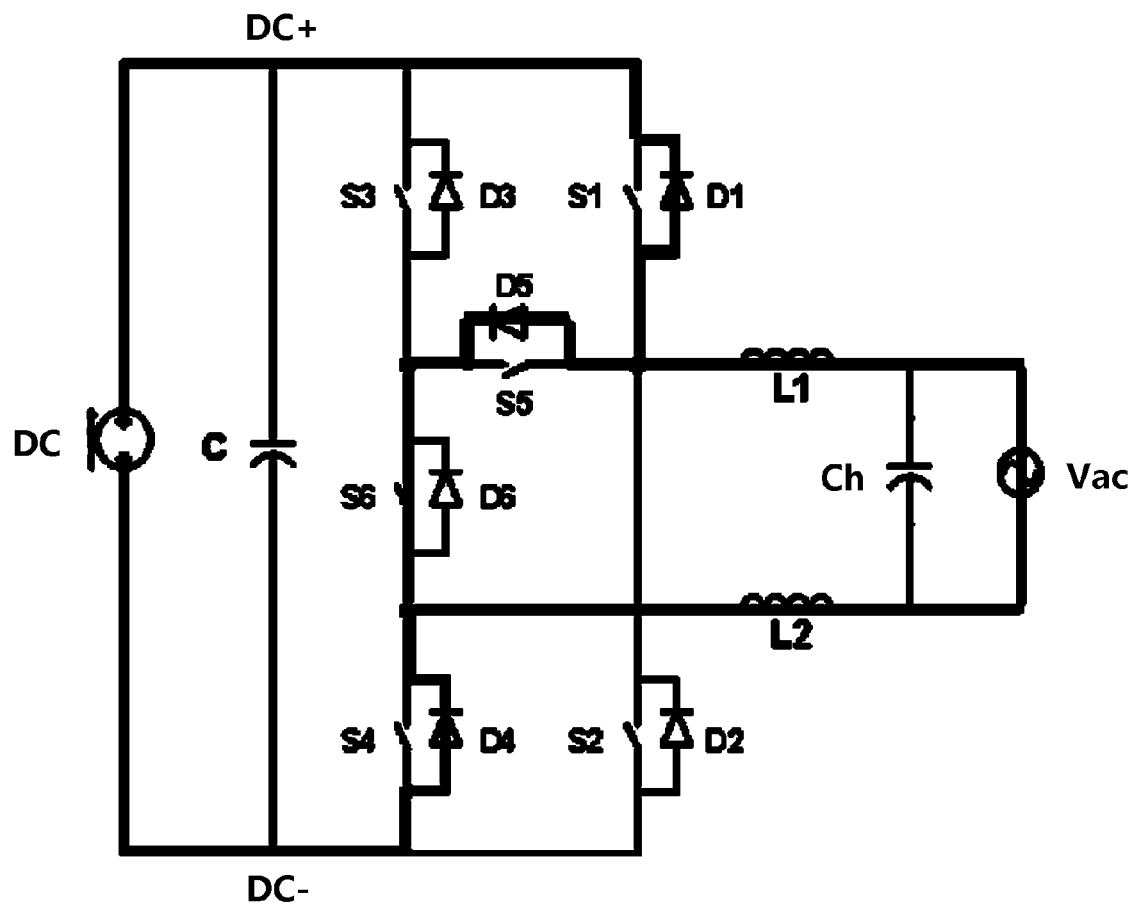
FIG. 9 is a schematic view illustrating a second process in which the six-transistor topology circuit shown in FIG. 1 operates in a rectifier mode.

FIG. 9 is a schematic view illustrating a second process, i.e., from t'1 to t'2 of the time, when the switching power converter shown in FIG. 1 operates in the rectifier mode. The driving signal of the switch transistor S6 is changed to the high voltage level from the low voltage level, and the switch transistor S6 is turned on. As indicated by thick solid line segments, the current begins to flow through the diode D5 and the switch transistor S6. During this process, the current in the branch of the diodes D1 and D4 is rapidly decreased. Meanwhile the current in the branch of the diode D5 and the switch transistor S6 is rapidly increased. Thereby, a high frequency current is equivalently generated, which flows sequentially through the positive terminal DC+ of the DC side, the diodes D1 and D5, the switch transistor S6, the diode D4 and the negative terminal DC− of the DC side. This process is a transient process from the turned-off state to the turned-on state of the diode D5 and the switch transistor S6, taking a time period as short as that in microsecond level or that even in nanosecond level.

Figure 10:
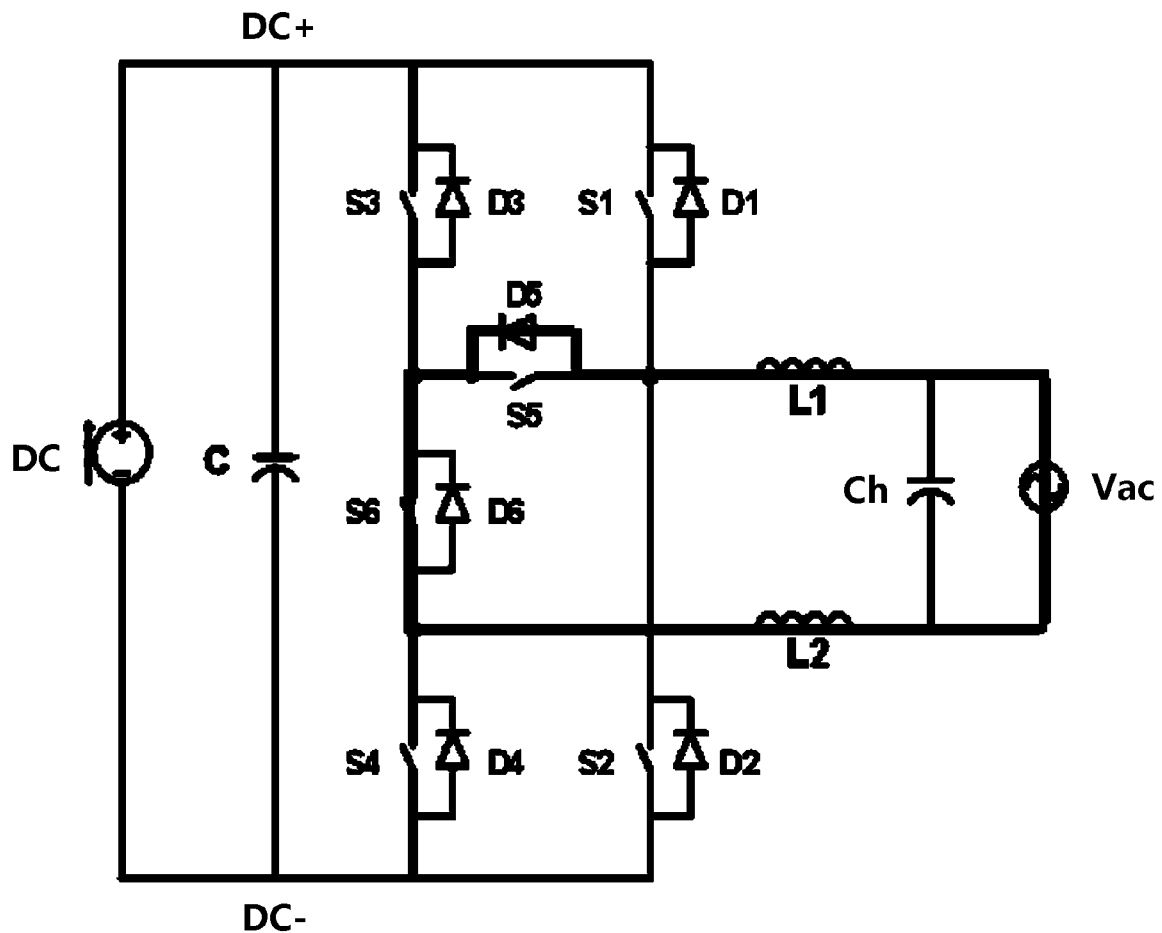
FIG. 10 is a schematic view illustrating a third process in which the six-transistor topology circuit shown in FIG. 1 operates in a rectifier mode.

FIG. 10 is a schematic view illustrating a third process, i.e., from t'2 to t'3 of the time, in which the switching power converter shown in FIG. 1 operates in the rectifier mode. The driving signal of the switch transistor S6 is at the high voltage level. The switch transistor S6 is turned on and diode D5 turns into an on state. As indicated by thick solid line segments, the current flows through the AC side Vac, the inductor L1, the diode D5 and the switch transistor S6 and the inductor L2.

Figure 11:
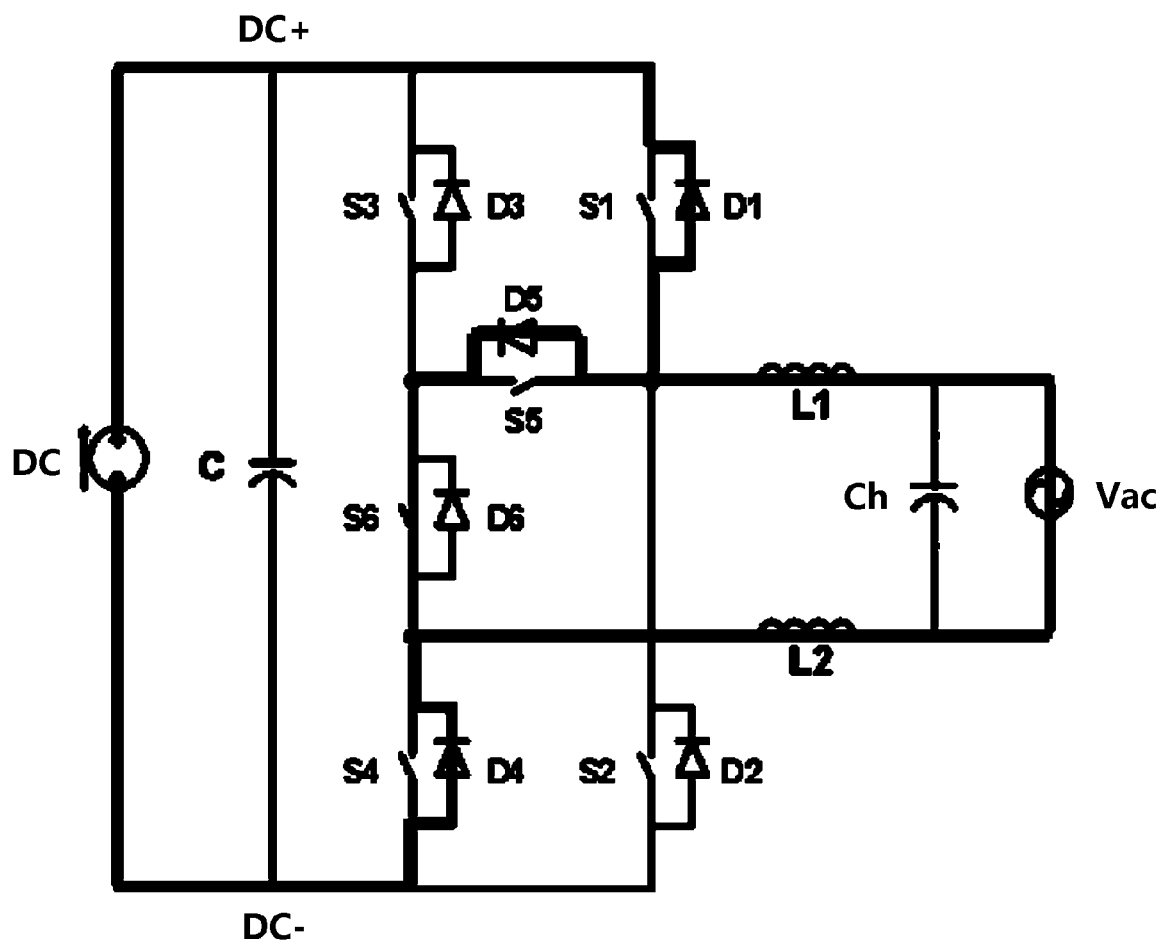
FIG. 11 is a schematic view illustrating a fourth process in which the six-transistor topology circuit shown in FIG. 1 operates in a rectifier mode.

FIG. 11 is a schematic view illustrating a fourth process, i.e., from t'3 to t'4 of the time, in which the switching power converter shown in FIG. 1 operates in the rectifier mode. The driving signal of the switch transistor S6 is changed to the low voltage level from the high voltage level, and the switch transistor S6 is going to be turned off. As indicated by thick solid line segment, the current begins to flow through the diodes D1 and D4. During this process, the current in the branch of the diode D5 and the switch transistor S6 is rapidly decreased. Meanwhile the current in the branch of the diodes D1 and D4 is rapidly increased. Thereby, a high frequency current is equivalently generated, which flows sequentially through the positive terminal DC+ of the DC side, the diodes D1 and D5, the switch transistor S6, the diode D4 and the negative terminal DC− of the DC side. This process is a transient process from the turned-on state to the turned-off state of the diodes D1 and D4, taking a time period as short as that in microsecond level or even that in nanosecond level.

Figure 12:
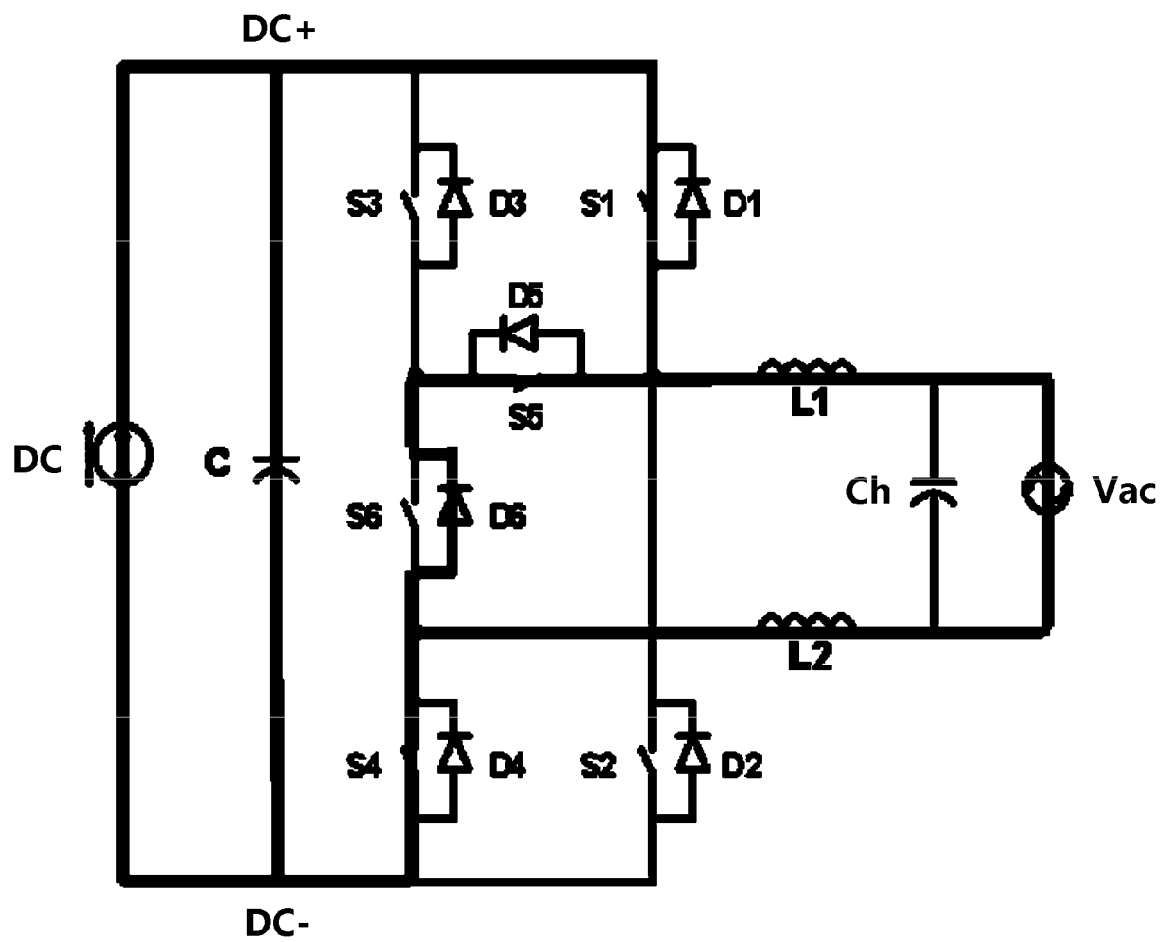
FIG. 12 is a schematic view illustrating a commutation loop of the six-transistor topology circuit shown in FIG. 1.

During the above operation of the switching power converter, since each of the switch components in the switching power converter has on/off states, the current will be switched between different branches, then commutation loops for current are also formed respectively corresponding to two operating modes of the switching power converter. FIG. 12 is a schematic view illustrating a commutation loop of the switching power converter shown in FIG. 1. As shown in FIG. 12, for example, in the second process shown in FIG. 5, the current in the branch of the switch transistors S1 and S4 is rapidly decreased, and meanwhile the current in the branch of the switch transistor S5 and D6 is rapidly increased. During the process, a current with high frequency is generated. The current with high frequency can also pass the first filter capacitor C which is connected to the positive terminal DC+ and the positive terminal DC+, Therefore, during the above operation of the switching power converter, a commutation loop is formed, constituted essentially by the switch transistors S1 and S5, the diode D6, the switch transistor S4 and the first filter capacitor C.

Figure 13A:
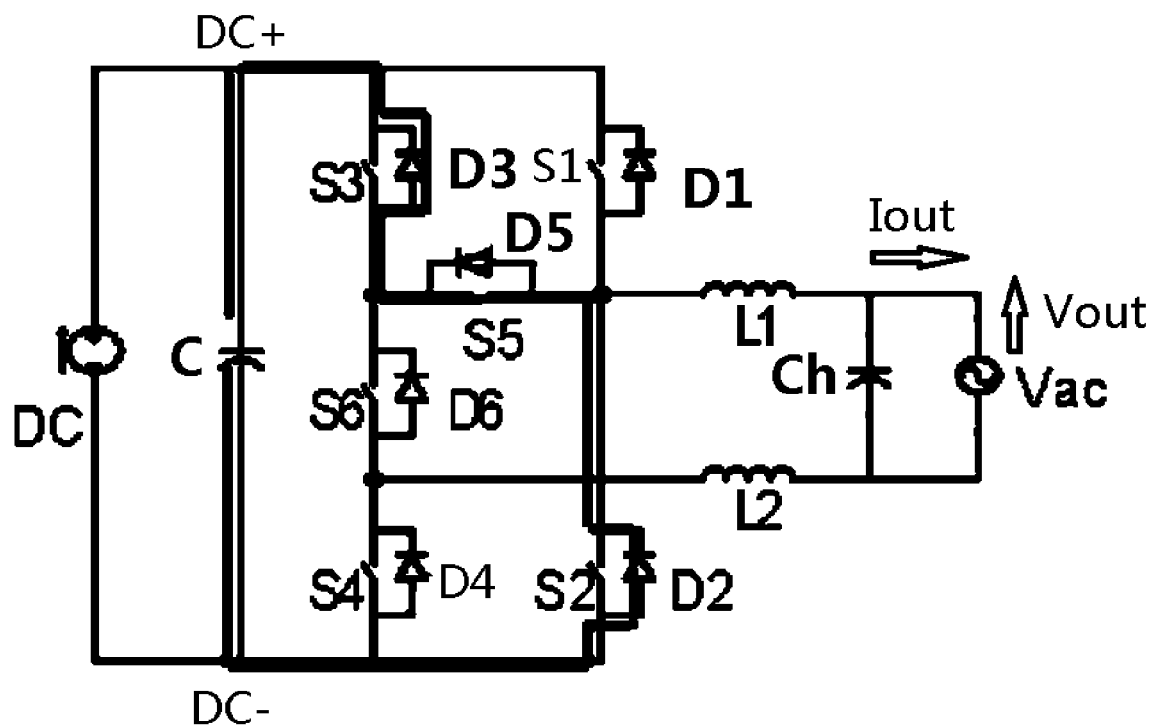
FIG. 13A is a schematic view illustrating another commutation loop of the six-transistor topology circuit shown in FIG. 1.
Figure 13B:
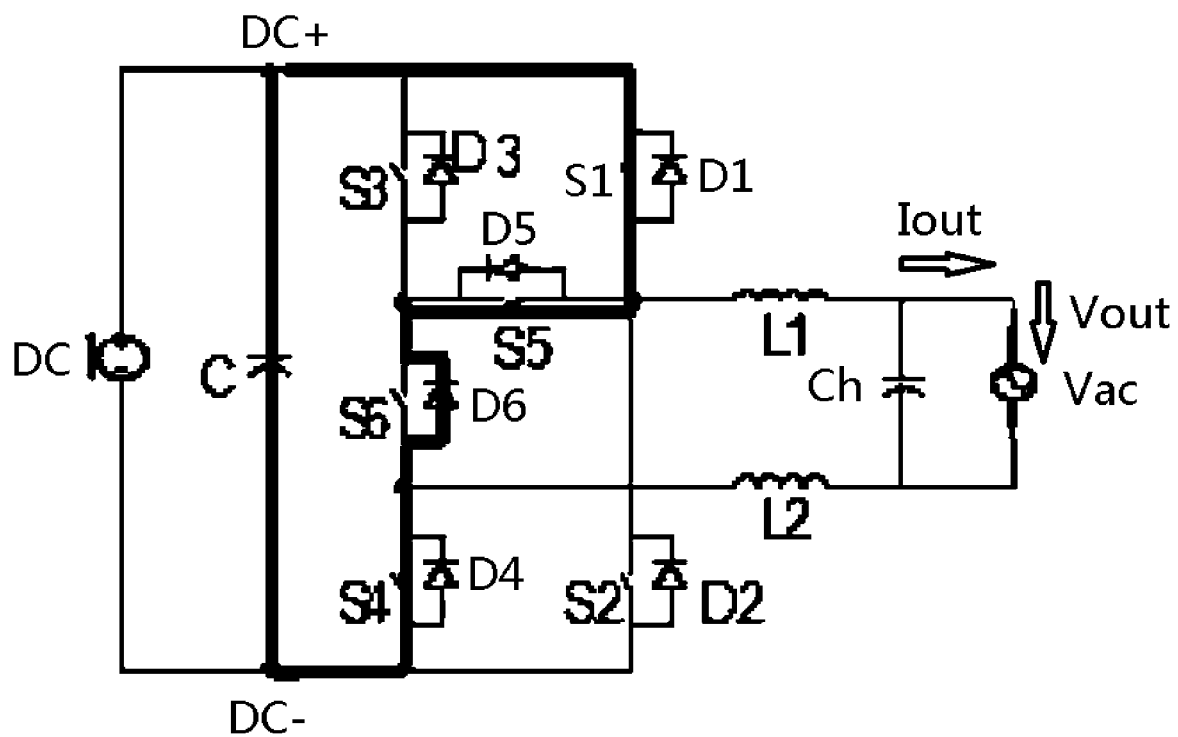
FIG. 13B is a schematic view illustrating further another commutation loop of the six-transistor topology circuit shown in FIG. 1.
Figure 13C:
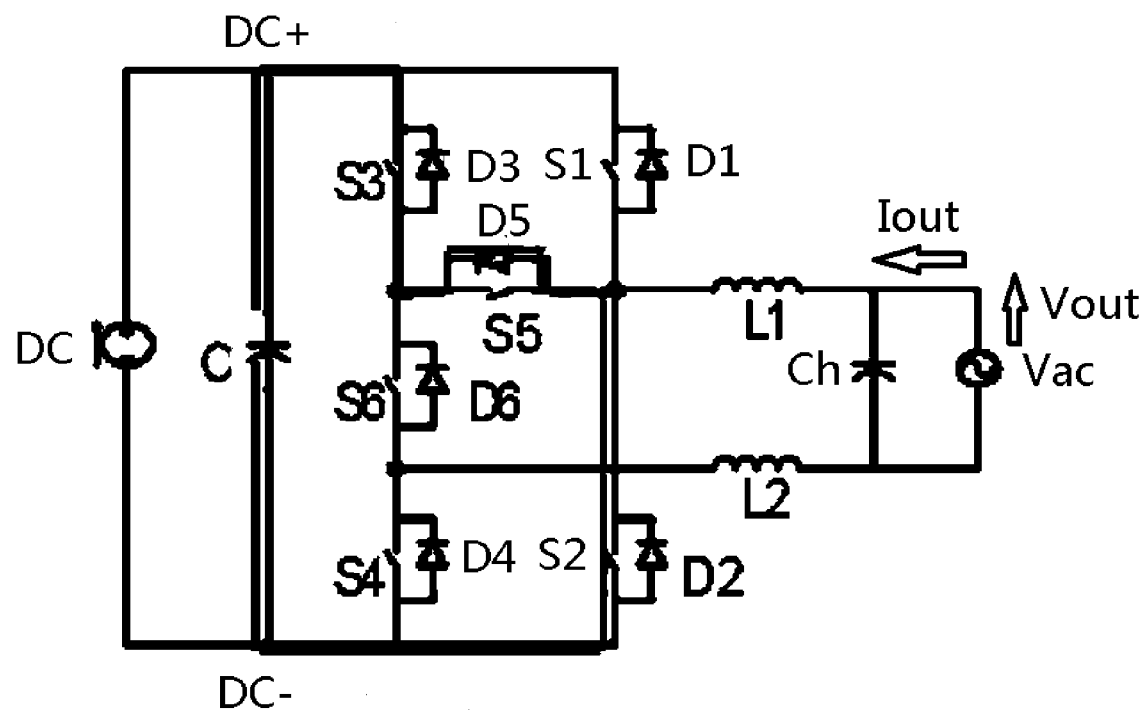
FIG. 13C is a schematic view illustrating still another commutation loop of the six-transistor topology circuit shown in FIG. 1.
Figure 13D:
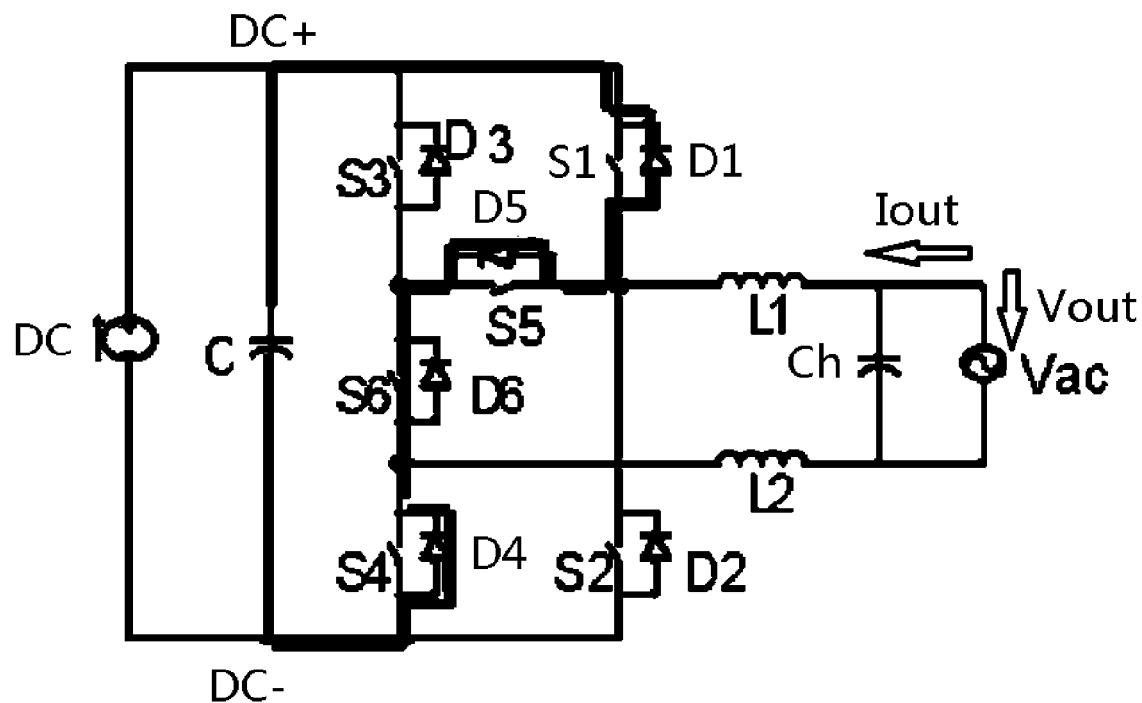
FIG. 13D is a schematic view illustrating yet another commutation loop of the six-transistor topology circuit shown in FIG. 1.

Following the above definition of commutation loop of the switching power converter, other commutation loops thereof operating in other modes may be obtained. Here, FIG. 13A is a schematic view illustrating another commutation loop of the switching power converter shown in FIG. 1. As shown in FIG. 13A, when the output voltage Vout is negative, and the output current Iout is positive, the commutation loop essentially is formed by the circuit bypassing the diode D2, the switch transistor S5, the diode D3 and the first filter capacitor C. FIG. 13B is a schematic view illustrating further another commutation loop of the switching power converter shown in FIG. 1. As shown in FIG. 13B, when the output voltage Vout is positive, and the output current Iout is positive, the commutation loop essentially is formed by the circuit bypassing the switch transistors S1 and S5, the diode D6, the switch transistor S4 and the first filter capacitor C. FIG. 13C is a schematic view illustrating still another commutation loop of the switching power converter shown in FIG. 1. As shown in FIG. 13C, when the output voltage Vout is negative, and the output current Iout is negative, the commutation loop essentially is formed by the circuit bypassing the switch transistor S2, the diode D5, the switch transistor S3 and the first filter capacitor C. FIG. 13D is a schematic view illustrating yet another commutation loop of the switching power converter shown in FIG. 1. As shown in FIG. 13D, when the output voltage Vout is positive, and the output current Tout is negative, the commutation loop essentially is formed by the circuit bypassing the diodes D1 and D5, the switch transistor S6, the diode D4 and the first filter capacitor C.

Since the switch components in the above switching power converter operates in a switching mode (particularly when the switch components operate alternately, as described above), energy stored in parasitic inductance in a commutation loop will be dissipated during switching, meanwhile, voltage spikes across the components will be increased by circuit parasitic parameters, which may reduce reliability of the system.

During the switching process, a ringing loss stored in circuit parasitic inductance and consumed may be calculated by Equation (1):

$$P_{ringing}=0.5*L_{loop}*I^2 \quad (1)$$

Wherein $L_{loop}$ denotes parasitic inductance of a commutation loop, I denotes a current in a switch transistor (or a diode) before the cutoff thereof, and $P_{ringing}$ denotes ringing loss of the loop.

During the switching process, voltage stress Vspike generated by the switching power converter may be calculated by Equation (2):

$$V\text{spike}=L_{loop}*di/dt \quad (2)$$

Wherein $L_{loop}$ denotes parasitic inductance of a commutation loop, di/dt is a change rate of the current in the commutation loop during the turning off of a switch transistor (or a diode) therein.

The above Equations (1) and (2) indicate that large circuit parasitic inductance will lead to poor electrical characteristic of the switching power converter. Parasitic parameters of a particular loop of prior art shown in FIG. 2 are extracted, and a three dimensional (3D) model of wire bonding and DBC ceramic substrate is established in accordance with the actual size of the switching power converter. Parts such as chips, solder or driving pins which have a small effect on the parasitic parameters may be neglected, and parasitic parameters with respect to a current changing rate during the commutation process are extracted. If the switching power converter mostly operates in an inverter mode, more attention will be paid to relevant characteristic in the inverter mode than that in the rectifier mode. In the inverter mode, the commutation loop of the prior art shown in FIG. 2 may be evaluated. As a result, the parasitic inductance of the commutation loop including the first filter capacitor C, the switch transistors S1 and S5, the diode D6 and the switch transistor S4 is 21.6 nH, and the parasitic inductance of the commutation loop composed of the first filter capacitor C, the switch transistor S2, the diode D5 and the switch transistor S3 is 17.6 nH. Therefore, in order to improve efficiency and stability of the switching power converter, the circuit parasitic inductance needs to be further reduced. Thus, the layout of the prior art requires further optimization.

Since the circuit parasitic inductance increases with the increasing of the length or area of the loop, the parasitic parameters of the commutation loop may be reduced by ensuring the switch components and capacitors close to each other in the commutation loop. One embodiment of the present disclosure is based on this method, to ensure the components included in the same commutation loop in the layout be as close as possible to each other. Actually it is easy to ensure the above first filter capacitor C close to the switch components, by connecting two or more capacitors in parallel. However, it is not easy to ensure switch components close to each other in the layout design of a switching power converter. One aspect of the present disclosure is to provide a new method for designing a layout of a switching power converter.

Figure 14:
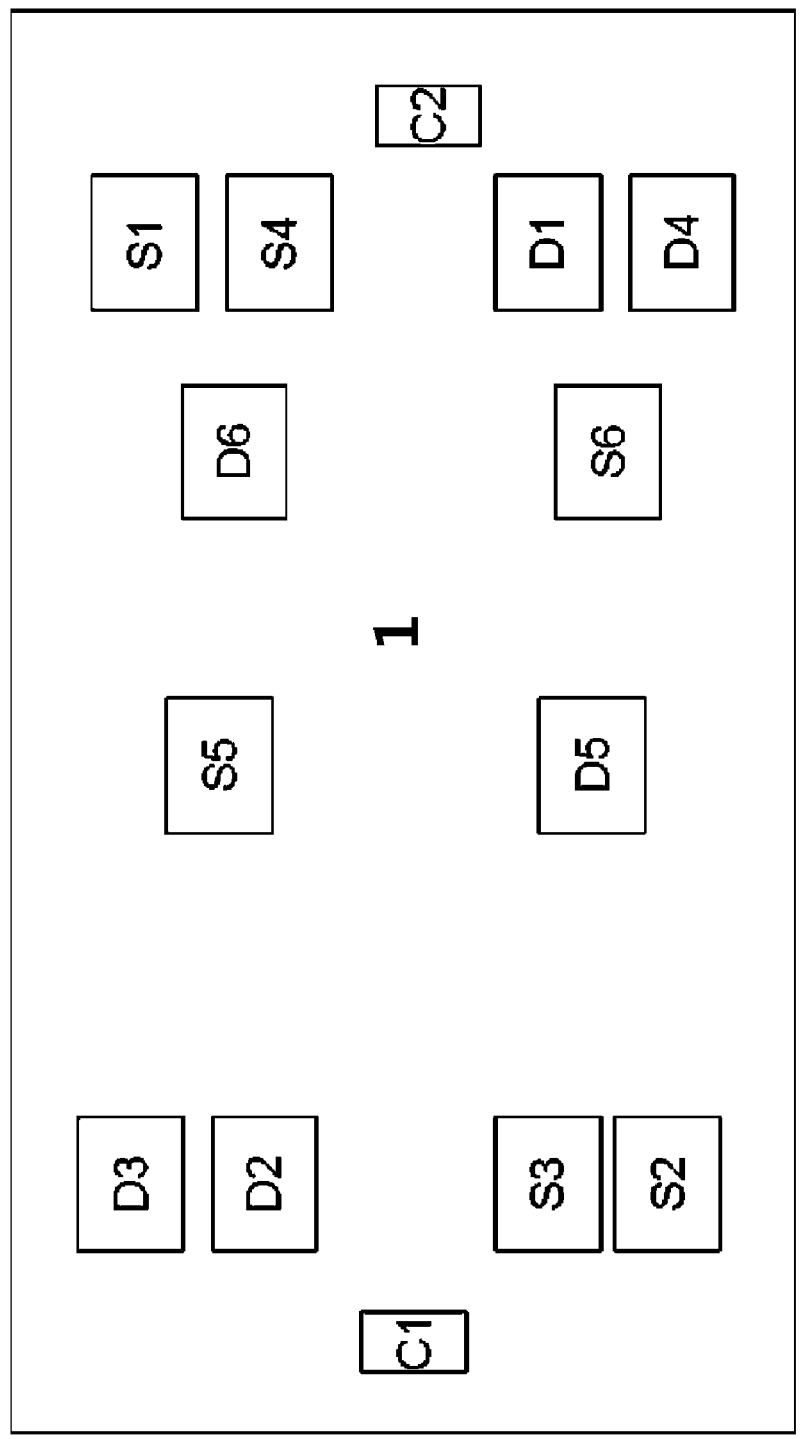
FIG. 14 is a schematic view illustrating a simplified embodiment of the layout of the switching power converter of the present disclosure.
Figure 15:
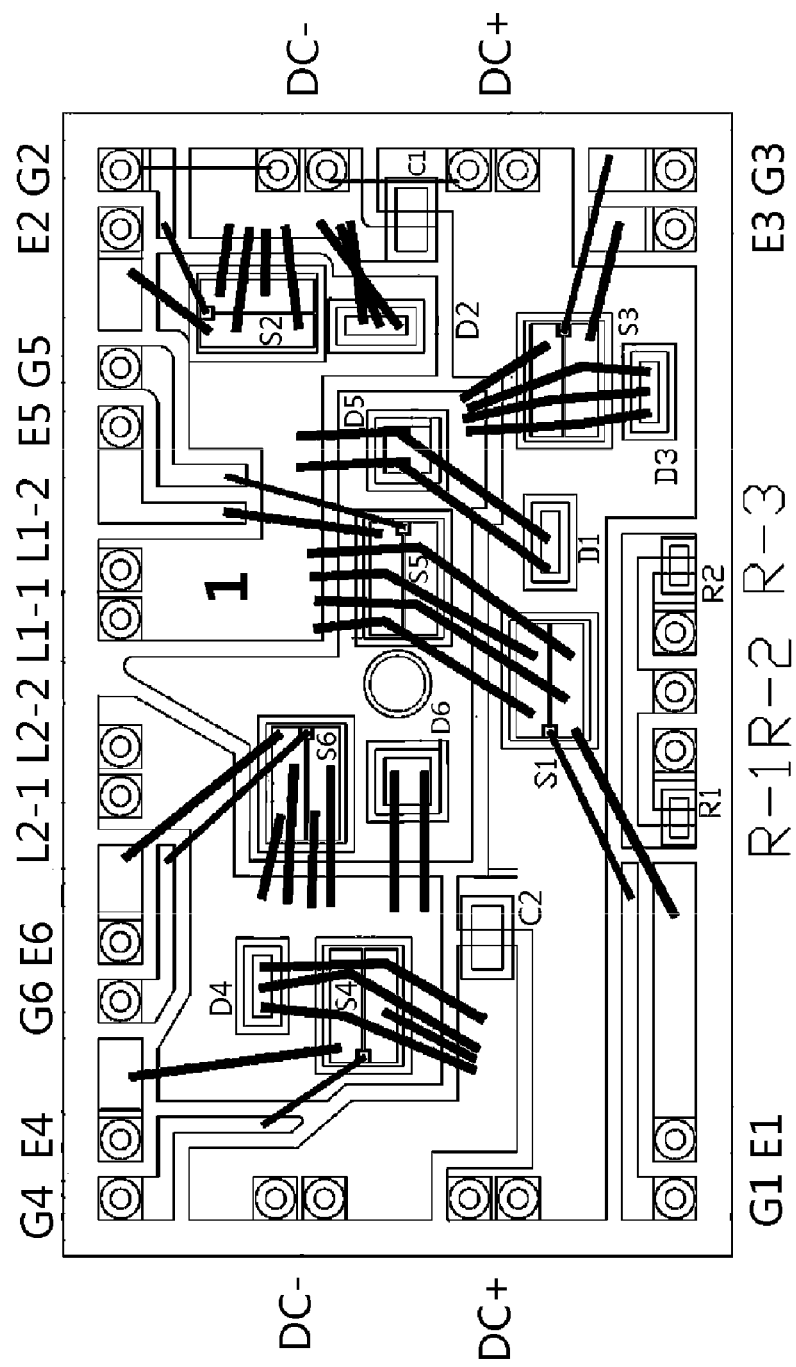
FIG. 15 is a layout of components in the 5 kW switching power converter according to the layout method of the components shown in FIG. 14.
Figure 16:
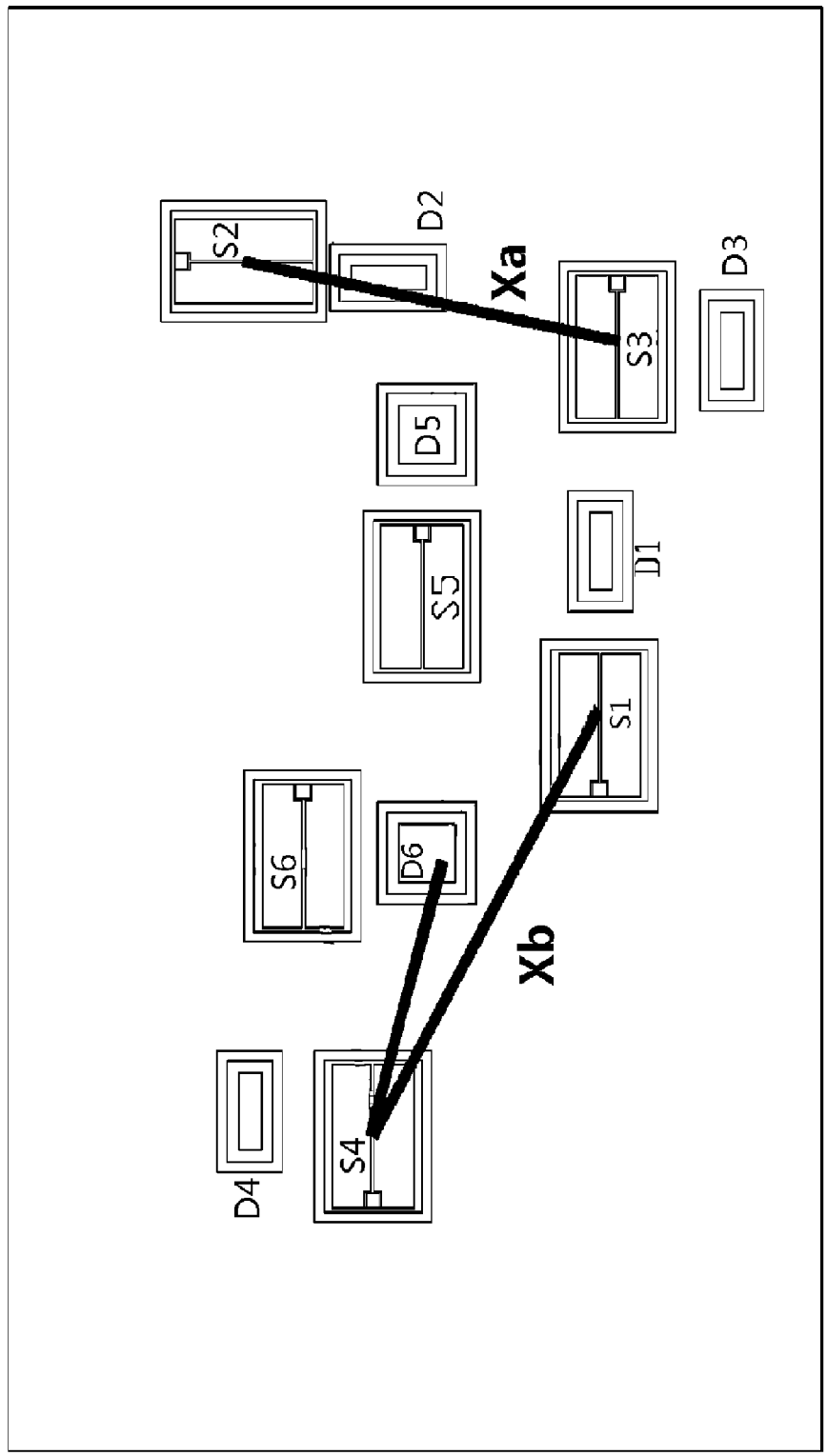
FIG. 16 is a simplified schematic view illustrating optimization of the layout of the components in the switching power converter shown in FIG. 15 in an inverter mode.
Figure 17:
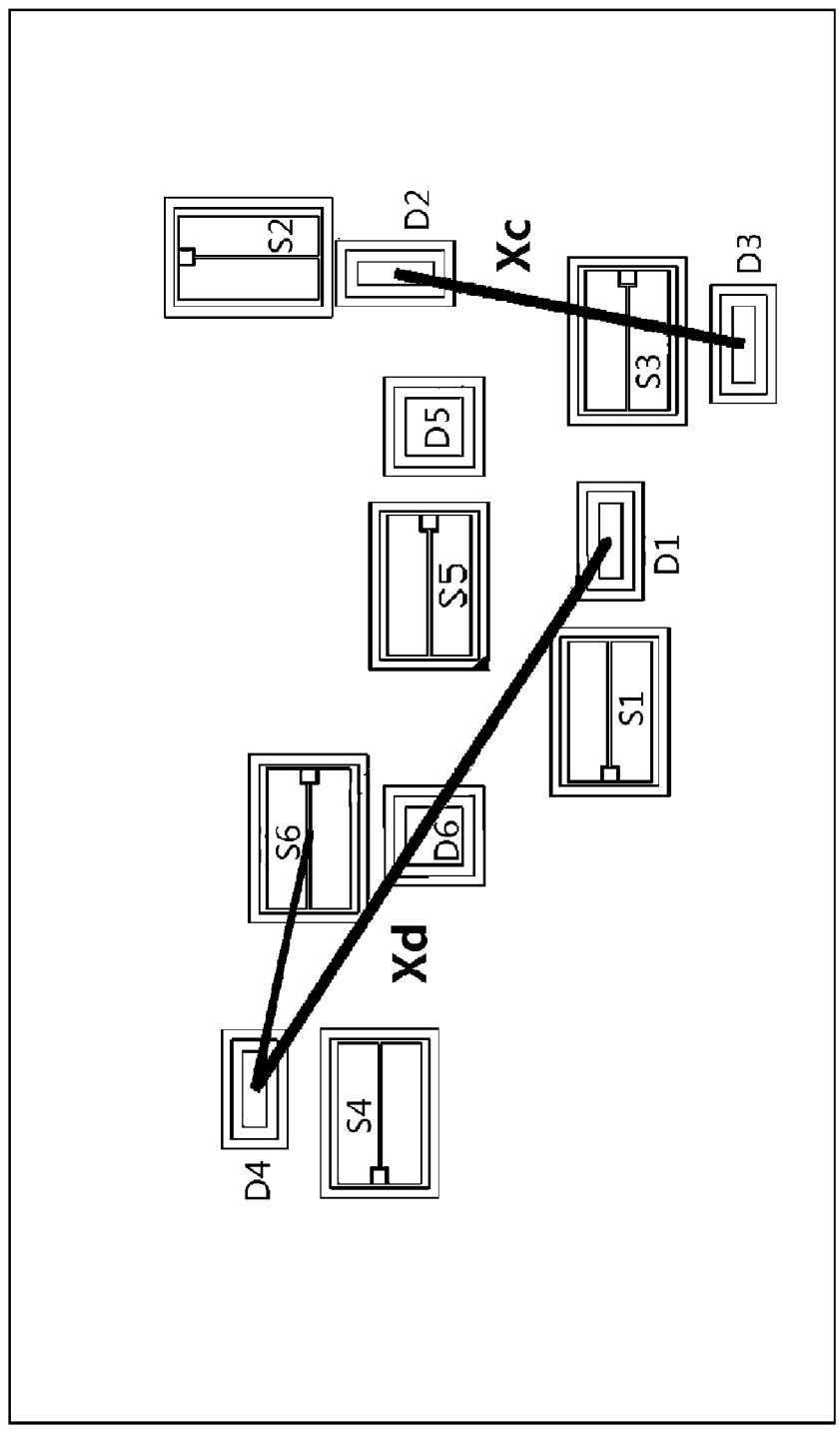
FIG. 17 is a simplified schematic view illustrating optimization of the layout of the components in the switching power converter shown in FIG. 15 in a rectifier mode.

FIG. 14 is a schematic view illustrating a simplified embodiment of the layout of the switching power converter shown in FIG. 1. FIG. 15 is a layout of components in the 5 kW switching power converter. FIG. 16 is a simplified schematic view of the layout of the components in the switching power converter shown in FIG. 15. FIG. 17 is a simplified schematic view of the layout of the components in the switching power converter served as rectifier shown in FIG. 15. The method of the layout of the switching power converter will be described in details as follow with reference to FIGS. 14-17.

As shown in FIG. 14, circuit parasitic parameters in a loop may be taken as the only factor for consideration. In the simplified schematic view of the switching power converter 1 shown in FIG. 14, the components in the layout include, from one side to the other side, the diode D3 and the switch transistor S1 located sequentially in the first row, the diode D2, the switch transistor S5, the diode D6 and the switch transistor S4 located sequentially in the second row, the filter capacitors C1 and C2 located sequentially in the third row, the switch transistor S3, the diode D5, the switch transistor S6 and the diode D1 located sequentially in the fourth row, and the switch transistor S2 and the diode D4 located sequentially in the fifth row. Wherein the filter capacitors C1 and C2 are connected in parallel, function as the first filter capacitor C shown in FIG. 1. The switch transistor S5 and the diode D5 are located at a middle position of the carrier board.

When the switching power converter shown in FIG. 14 operates only in an inverter mode, as described above, a first commutation loop are composed by the filter capacitor C1, the switch transistors S1 and S5, the diode D6 and the switch transistor S4, and a second commutation loop are composed by the filter capacitor C2, the switch transistor S2, the diode D5 and the transistor S3. Since both of the two commutation loops need to be considered, the switch transistors S1 and S4 and the diode D6 may be close to each other, and they may be located as closely as possible to the switch transistor S5; the switch transistors S2 and S3 may be close to each other, and they may be located as closely as possible to the diode D5. In addition, if the switch transistors are IGBTs, in view that the IGBTs cannot bear backward voltage, the switch transistor S5 may be close to the diode D5 in antiparallel therewith. Generally, when the switching power converter serves as an inverter, in order to reduce the circuit parasitic parameters in the inverter mode, the layout of the components in the switching power converter is optimized by ensuring that the switch transistors S1 and S4 and the diode D6 be close to each other as a component set, the switch transistors S2 and S3 be close to each other as another component set, and the two above sets be close to the switch transistor S5 and the diode D5 respectively.

When the switching power converter shown in FIG. 14 operates only in a rectifier mode, the switching power converter according to the present embodiment is used as a rectifier. In order to reduce the circuit parasitic parameters in the rectifier mode, as described above, the layout of the components in the switching power converter may be optimized by ensuring the diodes D1 and D4 and the switch transistor S6 be close to each other as a component set, the diodes D2 and D3 be close to each other as another component set, and the above two sets be close to the switch transistor S5 and the diode D5 respectively.

Hereinafter, taking the components included in the switching power converter shown in FIG. 1 as an example, the following will further describe how the embodiments of layouts of switching power converter reduce the parasitic parameters in the commutation loops. In the embodiment of the layout, all the semiconductor components except for the switch transistor S5 and the diode D5 in the switching power converter are divided into four sets: SETA, SETB, SETC and SETD.

The set SETA includes the components of the switch transistors S2 and S3.

The set SETB includes the components of the switch transistors S1 and S4 and the diode D6.

The set SETC includes the components of the diodes D2 and D3.

The set SETD includes the components of the diodes D1 and D4 and the switch transistor S6.

Then, when the switching power converter only serves as an inverter, the components in the set SETA may be close to each other, the components in the set SETB may be close to each other, and the set SETA and the set SETB may be close to the switch transistor S5 and the diode D5 respectively, to reduce the circuit parasitic parameters.

In order to describe the embodiment of a layout of the switching power converter shown in FIG. 16, a line segment Xa (i.e., a distance from the switch transistor S2 to the switch transistor S3) and a line segment Xb (i.e., a distance from the switch transistor S1 to the switch transistor S4, then continuously from the switch transistor S4 to the diode D6) are formed by connecting the gravity center of each component in the set SETA and the set SETB, wherein the gravity center of each component is defined as an endpoint of the line segment. Since each switch transistor is mostly close to the diode in antiparallel therewith, they are collectively referred to as a power transistor unit. Therefore, the above line segment Xa may also be represented as a distance from the power transistor unit including the switch transistor S2 to the power transistor unit including the switch transistor S3. The line segment Xb may also be represented as a sum of a distance from the power transistor unit including the switch transistor S4 to the power transistor unit including the switch transistor S1 and a distance from the power transistor unit including the switch transistor S4 to the power transistor unit including the diode D6.

Then, when the switching power converter only serves as an inverter (referring to FIGS. 13B and 13C), the length of the above first commutation loop may be calculated essentially as a sum of a length of the line segment Xb, a distance from the switch transistor S5 to the switch transistor S1 and a distance from the switch transistor S5 to the diode D6. The length of the above second commutation loop may be calculated essentially as a sum of a length of the line segment Xa, a distance from the diode D5 to the switch transistor S2 and a distance from the diode D5 to the switch transistor S3. For example, in a 5 kW switching power converter with six-transistor topology, a sum of the length of the line segment Xa and the length of the line segment Xb may be designed less than 60 mm so as to shorten the two commutation loops. Therefore average parasitic inductance of the two commutation loops may be reduced to be less than 12 nH.

In addition, there is another layout embodiment of the switching power converter. One rule of layout optimization in this embodiment for the components in the switching power converter is that the line segment Xa does not intersect with Xb. One way to implement this rule of layout optimization is to keep the second and third power transistor units and the first, fourth and sixth power transistor units separate from each other. Each power transistor unit includes a switch transistor and a diode connected therewith in antiparallel. In most situations, the diode is arranged in the vicinity of the switch transistor to make better use of reverse recovery of the diode for the switch transistor. In this way, line segments Xa and Xb do not intersect with each other. The actual purpose of both the two layout embodiments of the switching power converter set forth above is to shorten the commutation loops in the switching power converter.

In addition, when the switching power converter shown in FIG. 14 only serves as a rectifier, the components in the set SETC may be close to each other, the components in the set SETD may be close to each other, and the sets SETC and SETD may be close to the switch transistor S5 and the diode D5 respectively, to reduce the circuit parasitic parameters. Meanwhile, as shown in FIG. 17, a layout embodiment may be obtained as following. A line segment Xc (i.e., a distance from the diode D2 to the diode D3) and a line segment Xd (i.e., a distance from the diode D1 to the diode D4, and distance from the diode D4 to the switch transistor S6) are formed, wherein the line segment starts from gravity center of one component and ends at gravity center of other component. For example, in a 5 kW switching power converter with six-transistor topology, the area enclosed the first, fourth and sixth power transistor units do not overlap with the area enclosed the second and third power transistor units so that sum of the line segment Xc and Xd could be less than 60 mm.

In addition, when the switching power converter serves both as inverter and rectifier, the above all rules of layout optimization about inverter and the rectifier may be considered synthetically.

In addition, if the switch transistor in the power transistor unit is an IGBT, since the IGBT cannot endure backward voltage, the IGBT should connect a diode in antiparallel. Thus, IGBT S1, S2, S3, S4, S5 and S6 connect to diode D1, D2, D3, D4, D5 and D6 in antiparallel, respectively.

FIG. 15 is an overall layout of components in the 5 kW switching power converter. As shown in FIG. 15, besides the capacitors and the semiconductor chips in the six-transistor topology shown in FIG. 1, two resistors R1 and R2 are integrated and led out through three pins. Here, thick solid line segments represent bonding wires, and closed figures surrounded by thin solid line segments represent the DBC ceramic substrate. In the switching power converter shown in FIG. 15, the components in the layout include, from top side to bottom side, the diode D4, the switch transistors S6 and S2 located sequentially in the first row, the switch transistor S4, the diode D6, the switch transistor S5, the diodes D5 and D2 and the filter capacitor C1 located sequentially in the second row, the filter capacitor C2, the switch transistor S1, the diode D1 and the switch transistor S3 located sequentially in the third row, and the resistors R1 and R2 and the diode D3 located sequentially in the fourth row.

At edges of the switching power converter shown in FIG. 15, a plurality of pins are distributed around four sides of the layout. Starting from the top left corner of the switching power converter, in a clockwise direction, the pins are respectively pins G4 and E4 of the switch transistor S4, pins G6 and E6 of the switch transistor S6, two pins L2-1 and L2-2 of the inductor L2, two pins L1-1 and L1-2 of the inductor L1, pins E5 and G5 of the switch transistor S5, pins E2 and G2 of the switch transistor S2, two negative terminals DC− and two positive terminals DC+ of the DC side, pins G3 and E3 of the switch transistor S3, pins R-3, R-2 and R-1 of the internally integrated resistors R2 and R1, pins E1 and G1 of the switch transistor S1, two positive terminals DC+ and two negative terminals DC− of the DC side.

FIG. 16 is a simplified schematic view of the layout of the switching power converter shown in FIG. 15 served as an inverter. It may be understood that, when the switching power converter only serves as an inverter, by connecting the gravity centers of the corresponding components, the line segments Xa and Xb may be obtained, wherein the line segment Xa and the line segment Xb do not intersect with each other and a sum of the length of the line segment Xa and the length of the line segment Xb would be less than 60 mm.

FIG. 17 is a simplified schematic view of the layout of the switching power converter shown in FIG. 15 served as a rectifier. With reference to FIGS. 13B and 13C and the first and second commutation loops therein, it may be understood that, when the switching power converter only serves as the rectifier, by connecting the gravity centers of corresponding components, the line segments Xc and Xd could be obtained. A sum of the lengths of the line segment Xc and the line segment Xd could be less than 60 mm.

In addition, if the switching power converter mostly serves as an inverter, and occasionally serves as a rectifier, the requirement for the layout for the inverter shall be satisfied in priority. For example, in a 5 kW switching power converter, following the rule of layout optimization illustrated above, it is easy to ensure the line segments Xa and Xb do not intersect with each other and a sum of the lengths thereof is 44.6 mm. Meanwhile, the line segments Xc and Xd do not intersect with each other, and a sum of the lengths thereof is 60 mm. Specifically, parasitic parameters of a particular circuit are extracted, and a three dimensional model of wire bonding and DBC ceramic substrate is established in accordance with the actual size of the switching power converter. Parts such as chips, solder or pins which have a small effect on the parasitic parameters may be neglected, and parasitic parameters which affect a current changing rate during the commutation process are extracted. In this way, the circuit parasitic inductance of the established first commutation loop (including the switch transistors S1 and S5, the diode D6, the switch transistor S4 and the filter capacitor C2) of the switching power converter is 13.0 nH, the circuit parasitic inductance of the second commutation loop (including the switch transistor S2, the diode D5, the switch transistor S3 and the filter capacitor C1) is 10.9 nH. In comparison to counterpart product of 21.6 nH and 17.6 nH in the prior art, the parasitic inductance of the commutation loops of the layout embodiment of the switching power converter is reduced by about 40%. Meanwhile, the parasitic inductance of the commutation loops of the layout of the switching power converter served as a rectifier is also improved.

For better description of the present disclosure, other embodiments of the present disclosure are further provided hereinafter.

Figure 18:
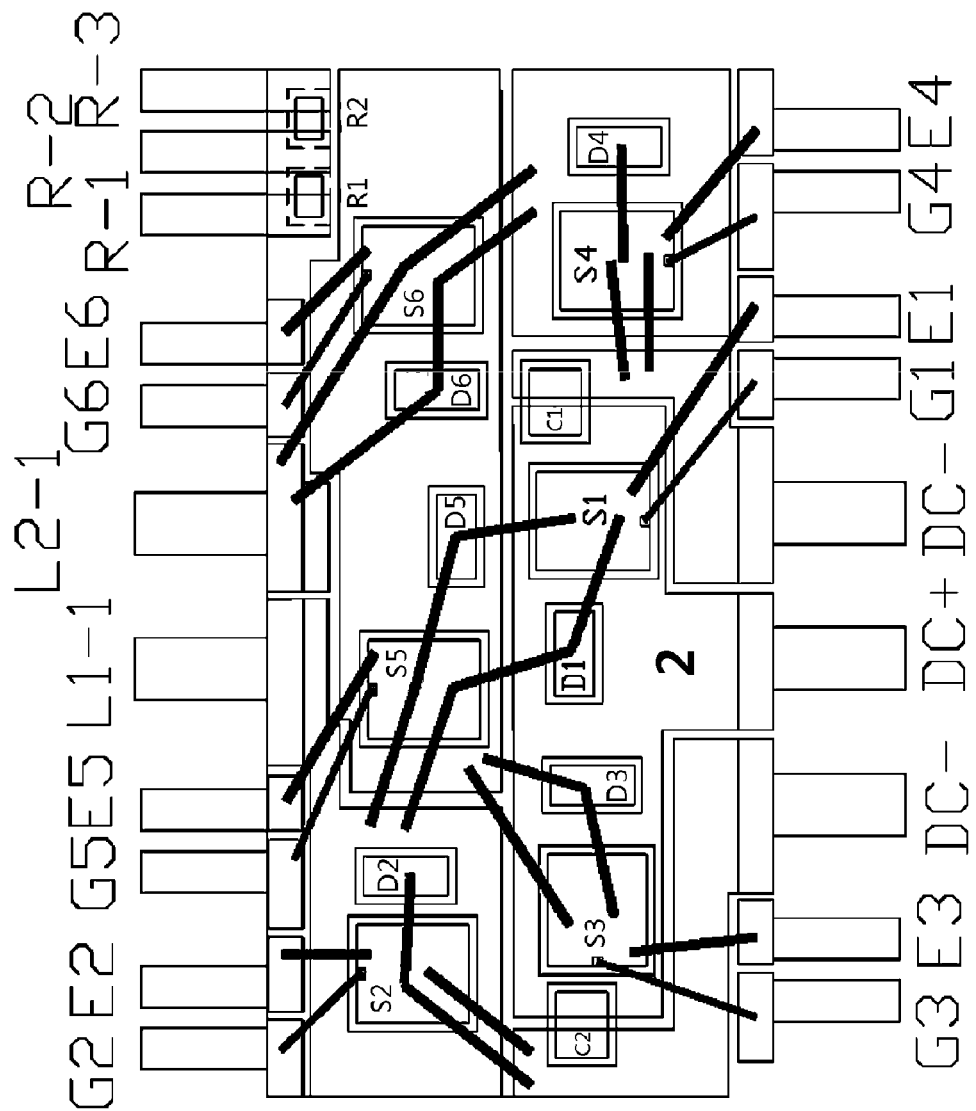
FIG. 18 shows another embodiment of the layout of the switching power converter according to the present disclosure.

FIG. 18 shows another layout embodiment of the switching power converter. FIG. 18 shows a layout of a switching power converter with six-transistor topology of another package type, which may be used to produce a 3 kW switching power converter. Here, thick solid line segments represent bonding wires, and closed figures surrounded by thin solid line segments represent DBC ceramic substrate. In the switching power converter 2 shown in FIG. 18, the components in the layout include, from one side to the other side, the switch transistor S2, the diode D2, the switch transistor S5, the diodes D5 and D6, the switch transistor S6 and the resistors R1 and R2 located sequentially in the first row, and the filter capacitor C2, the switch transistor S3, the diodes D3 and D1, the switch transistor S1 the filter capacitor C1, the switch transistor S4 and the diode D4 located sequentially in the second row.

At edges of the switching power converter shown in FIG. 18, a plurality of pins are distributed at two sides (i.e., an upper side and a lower side) of the switching power converter. At a first side (i.e., the upper side), from one side to the other side, the pins are sequentially the pins G2 and E2 of the switch transistor S2, the pins G5 and E5 of the switch transistor S5, the pin L2-1 of the inductor L2, the pin L1-1 of the inductor L1, the pins G6 and E6 of the switch transistor S6, and the pins R-1, R-2 and R-3 of the internally integrated resistors R1 and R2. At a second side (i.e., the lower side), from one side to the other side, the pins are sequentially the pins G3 and E3 of the switch transistor S3, a negative terminal DC− of the DC side, a positive terminal DC+ of the DC side, a negative terminal DC− of the DC side, the pins G1 and E1 of the switch transistor S1 and the pins G4 and E4 of the switch transistor S4.

Figure 19:
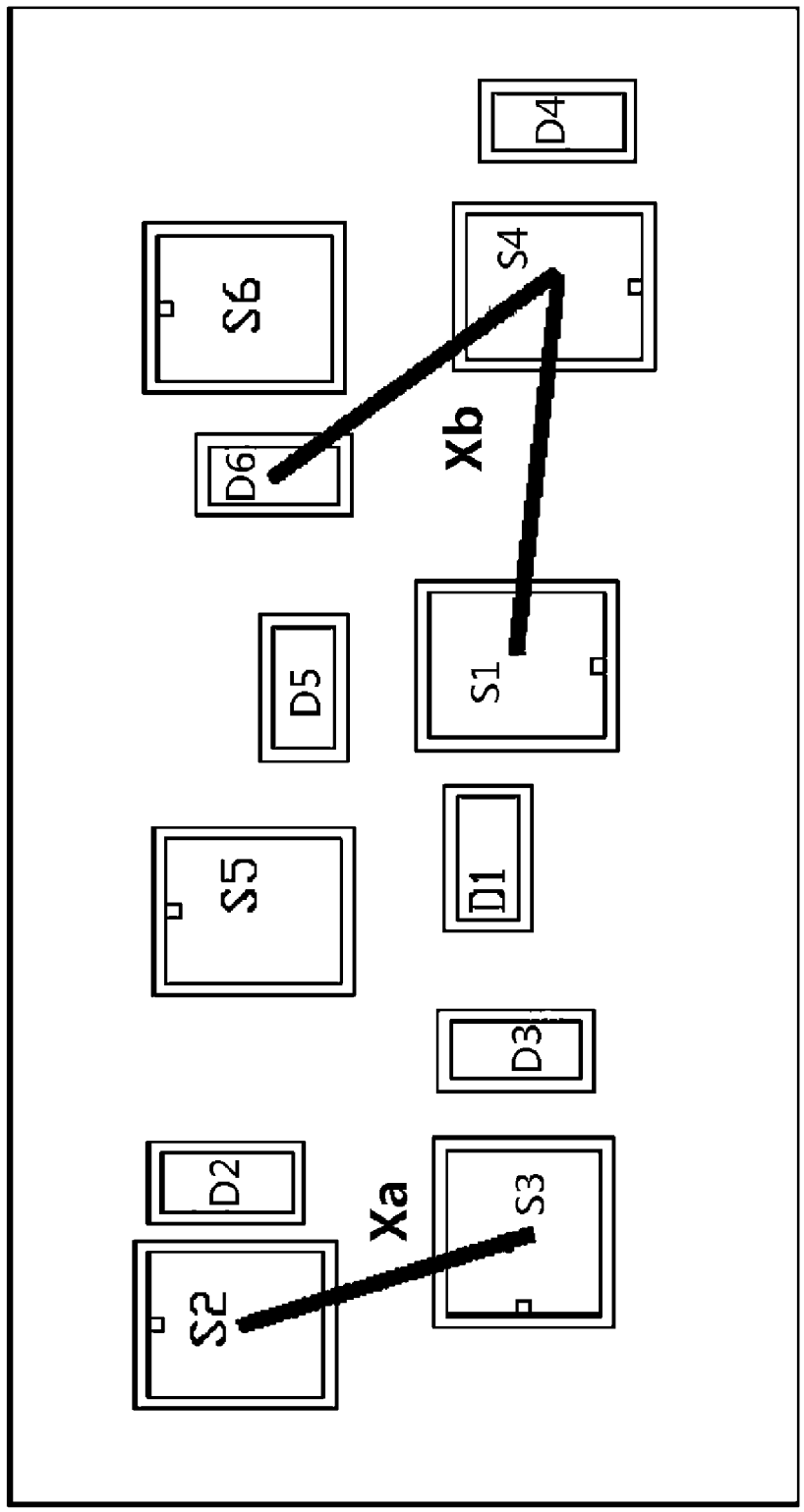
FIG. 19 is a simplified schematic view illustrating optimization of the layout of the components in the switching power converter shown in FIG. 18 in an inverter mode.

FIG. 19 is a simplified schematic view of the layout embodiment of the switching power converter shown in FIG. 18 in served as an inverter. With reference to the above description with respect to the first and second commutation loops, it may be understood that, when the switching power converter only serves as an inverter, by connecting the gravity centers of corresponding components, the line segments Xa and Xb may be obtained. In this embodiment, the line segments Xa and Xb do not intersect with each other, and a sum of the lengths of the line segment Xa and line segment Xb could be less than 60 mm.

Figure 20:
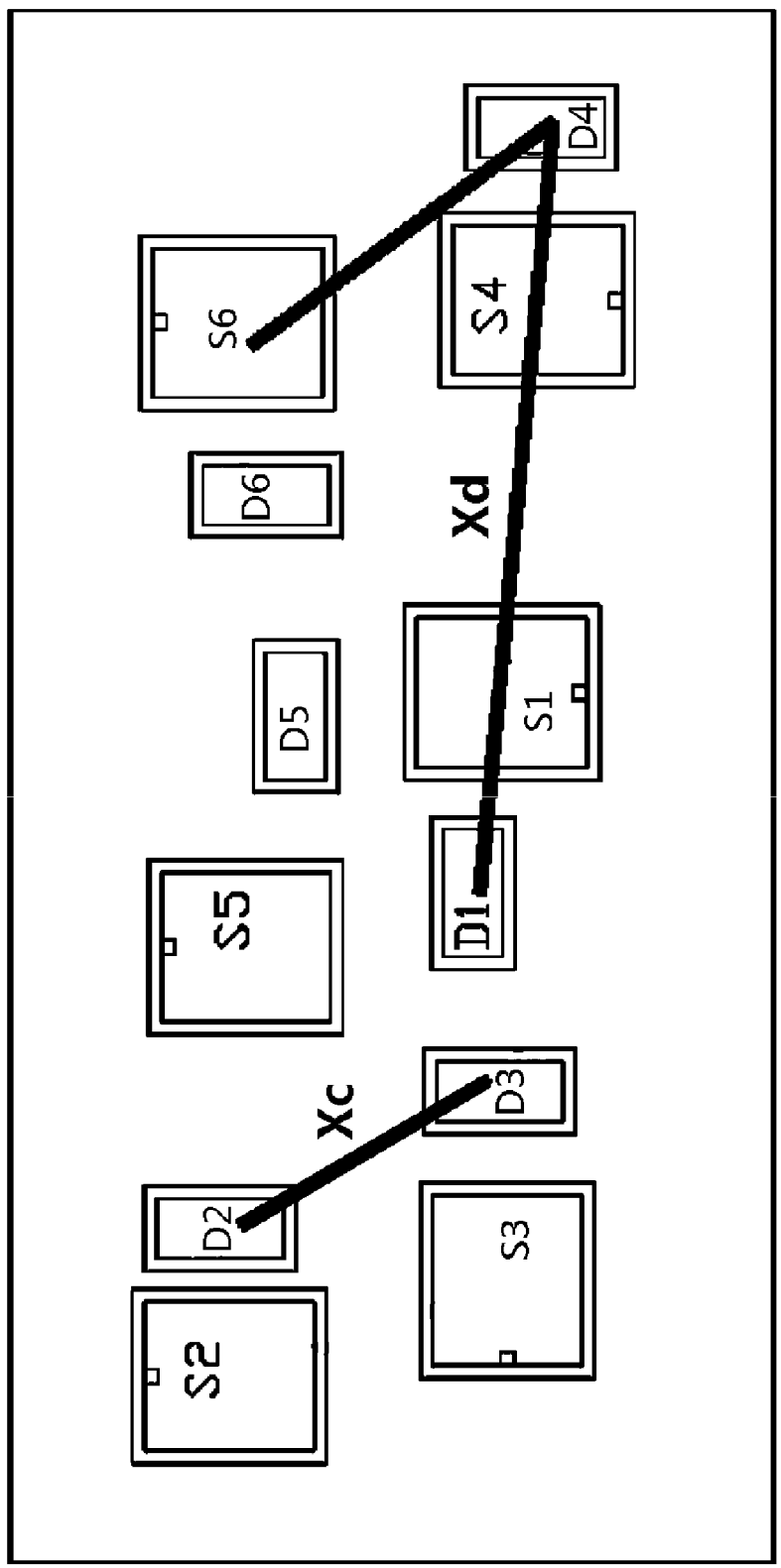
FIG. 20 is a simplified schematic view illustrating optimization of the layout of the components in the switching power converter shown in FIG. 18 in a rectifier mode.

In addition, FIG. 20 is a simplified schematic view the layout embodiment of the switching power converter shown in FIG. 18 served as a rectifier. Although the layout of specified components has not changed compared to that in FIG. 19, the commutation loops to be considered are different according to different functions of the switching power converter. With reference to the above description about the first and second commutation loops, it may be understood that, when the switching power converter only serves as a rectifier, the line segments Xc and Xd are selected to be considered. In this embodiment, a sum of the lengths of the line segments Xc and Xd could be able to be less than 60 mm.

Figure 21:
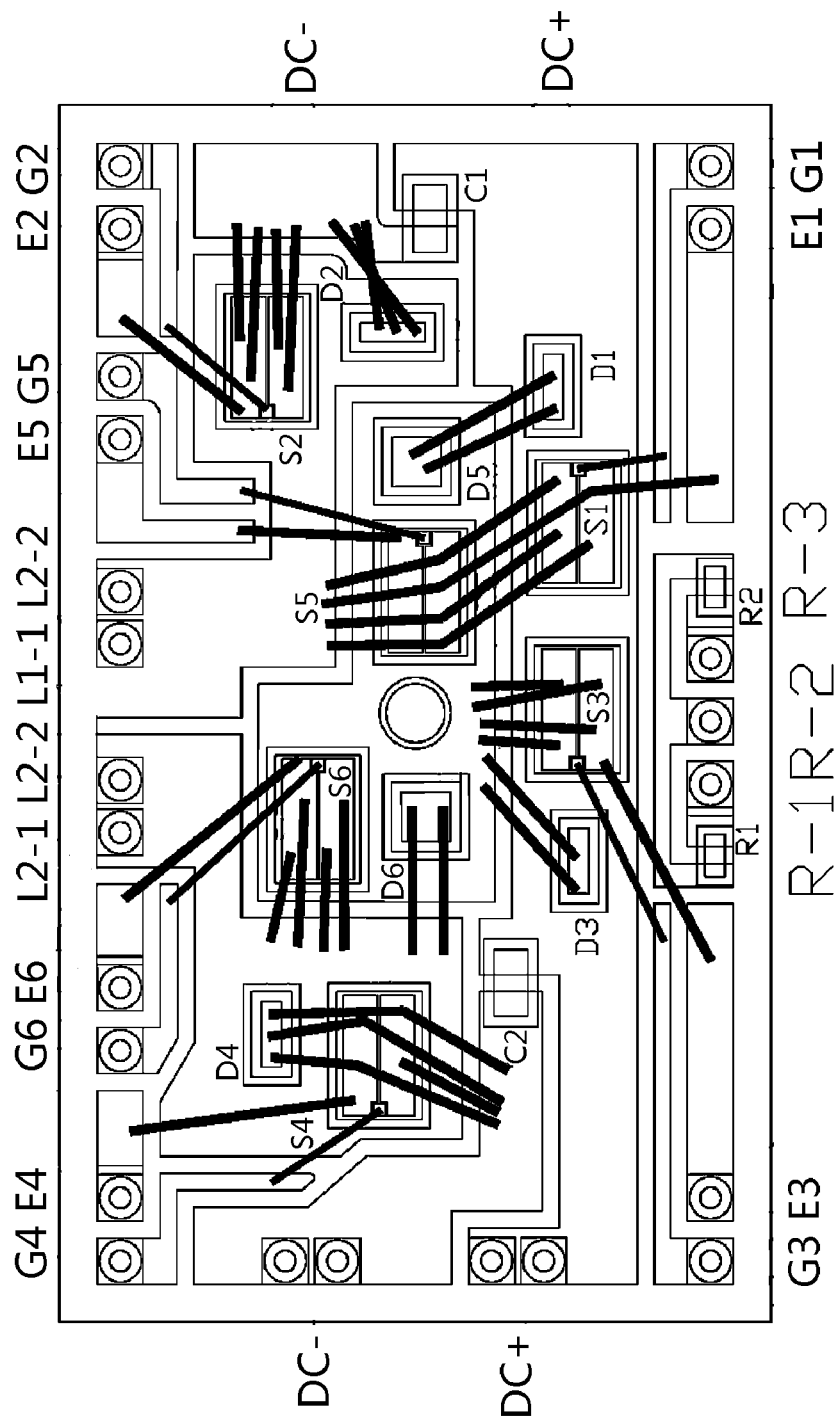
FIG. 21 shows an embodiment of an overall layout of a switching power converter of the present disclosure.
Figure 22:
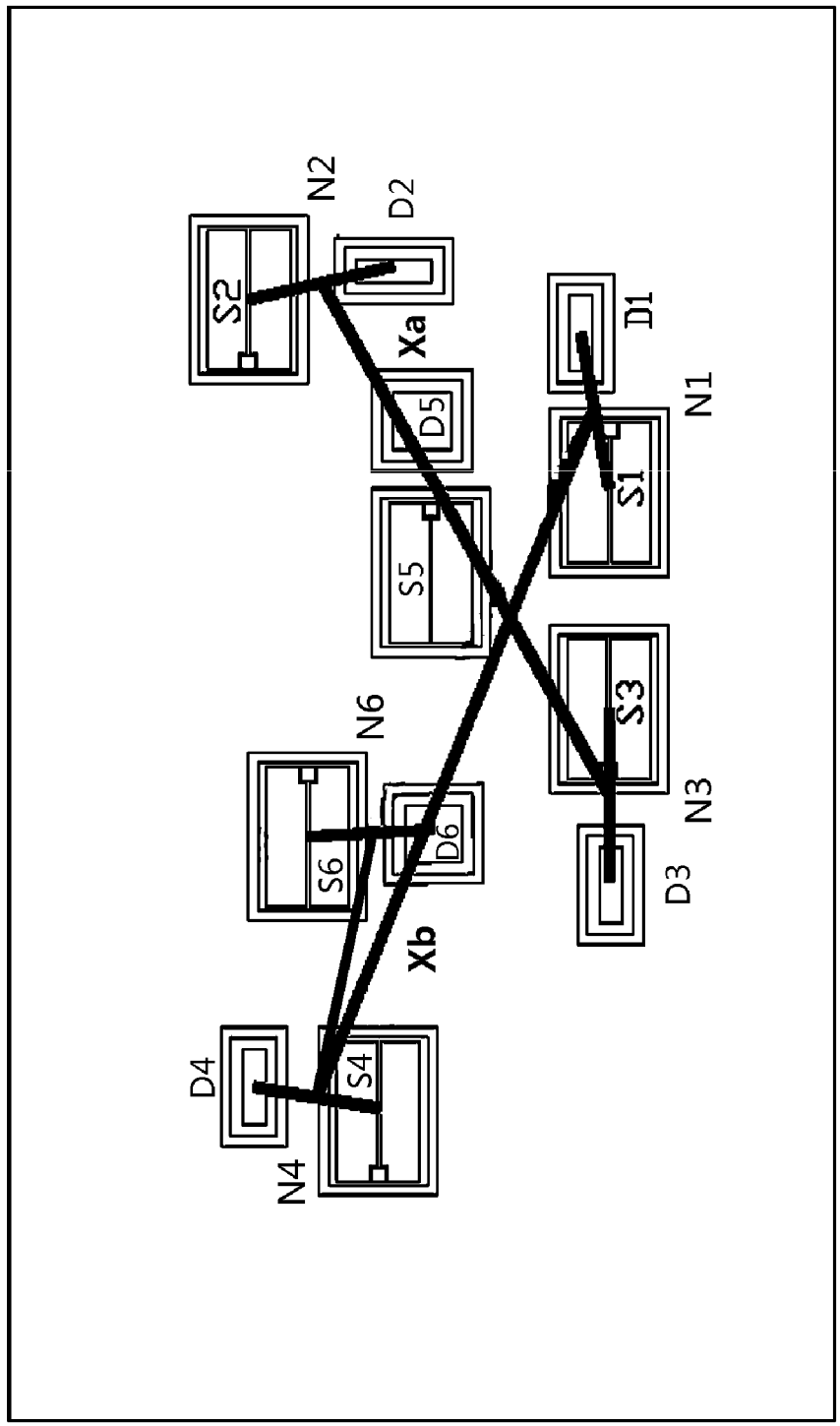
FIG. 22 is a simplified schematic view of FIG. 21 illustrating layout of the switching power converter serving as an inverter.

In actual layout of the switching power converter, it may still follow the rule to ensure the commutation loops as short as possible so that the fifth power transistor unit is located at a middle position of the carrier board, and other five power transistor units surround the fifth power transistor unit as closely as possible. There are some layout embodiments that follow this rule to arrange the six power transistor units, in which the line segments Xa and Xb intersect with each other because of other rule of layout optimization not mentioned above. Please refer to FIG. 21, which shows a layout embodiment of a switching power converter that line segments Xa and Xb intersect with each other. FIG. 21 shows an overall layout embodiment of a switching power converter. As shown in FIG. 21, the first power transistor unit includes the switch transistor S1 and the diode D1, the second power transistor unit includes the switch transistor S2 and the diode D2, the third power transistor unit includes the switch transistor S3 and the diode D3, the fourth power transistor unit includes the switch transistor S4 and the diode D4, the fifth power transistor unit includes the switch transistor S5 and the diode D5, and the sixth power transistor unit includes switch transistor S6 and the diode D6. The fifth power transistor unit is located at a middle position of the carrier board, and other five power transistor units surround the fifth power transistor unit as closely as possible. Please refer to FIG. 22, which is a simplified layout of the switching power converter shown in FIG. 21. In this embodiment, two endpoints of line segment Xa shall be the midpoints of line segments connecting the switch transistor and diode in the second and third power transistor units respectively. Line segment Xb is constituted by the line segment connecting midpoints of the fourth and sixth power transistor unit and line segment connecting midpoints of the fourth and first power transistor unit. The midpoint of the power transistor unit is defined as the midpoint of line segment connecting the transistor and diode in the power transistor unit. As shown in FIG. 22, line segments Xa and Xb intersect with each other. Although the arrangement of six power transistor units in this embodiment is not the best one, it is still superior to that of the switching power converter in prior art.

Figure 23:
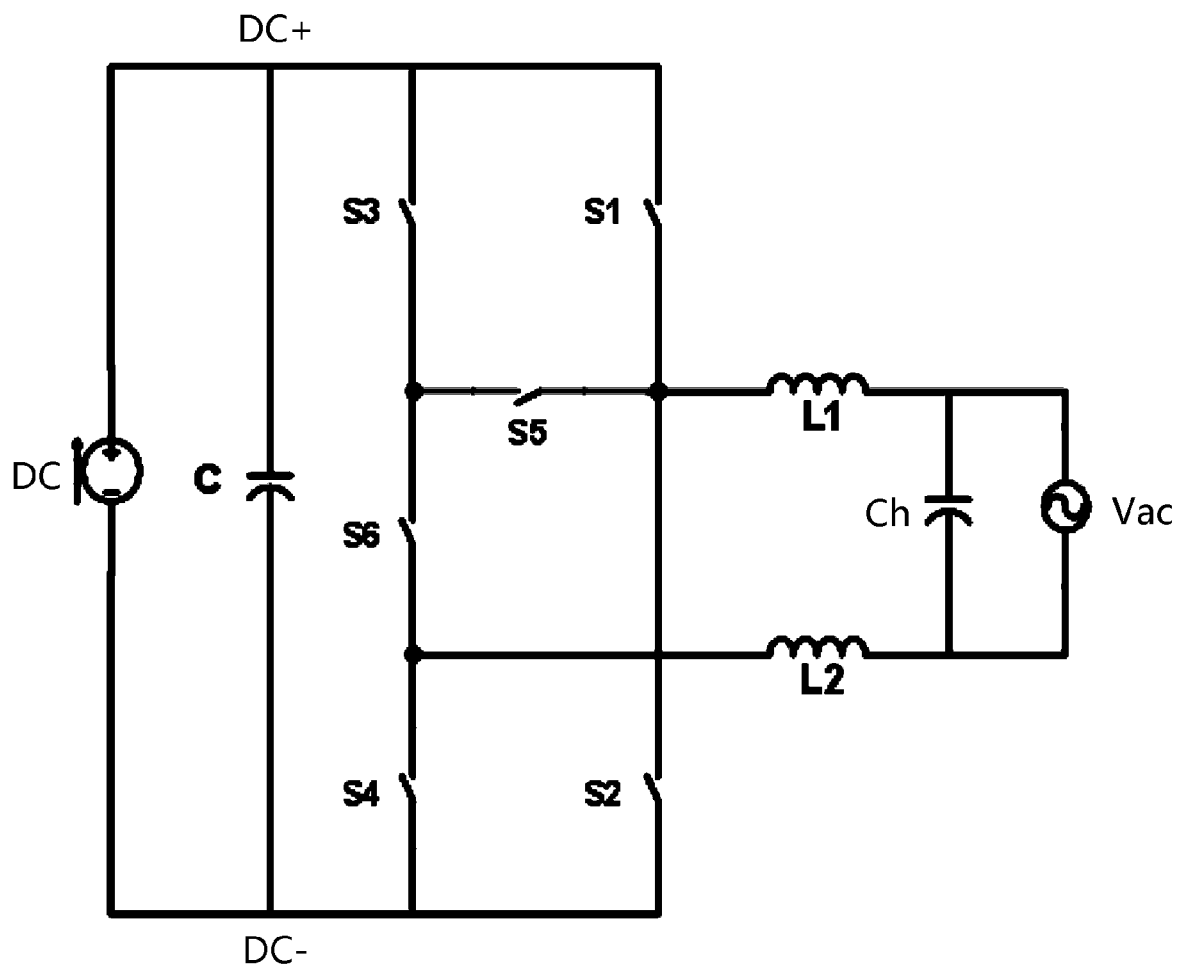
FIG. 23 is a schematic circuit diagram of an inverter with six-transistor topology according to an embodiment of the present disclosure.

In addition, with the development of semiconductor technology, new components are kept emerging. In some day, there will be a kind of IGBT which allows current to flow reversely. Therefore, the six-transistor topology may be changed accordingly, and the diodes in antiparallel of the IGBT may be omitted. One embodiment of the present disclosure also takes this situation into consideration. For example, FIG. 23 is a topology circuit of the switching power converter employed this kind of IGBT which allows current to flow reversely. As shown in FIG. 23, the six IGBTs in the six-transistor topology have no diode in antiparallel, so whether the switching power converter serves as an inverter, a rectifier or both, the commutation loops are the same in consideration for the layout optimization of a switching power converter, the first commutation loop is essentially constituted by the switch transistors S1, S5, S6 and S4, and the second commutation loop essentially is constituted by the switch transistors S2, S5 and S3

For the situation shown in FIG. 23, the rule of layout optimization of the switching power converter illustrated by the above-mention embodiments is still applicable. Specifically, all of the switch components except for the switch transistor S5 are divided into two sets of SETA and SETB. In this embodiment, each power transistor unit only includes a switch transistor.

The set SETA includes the components of the switch transistors S2 and S3.

The set SETB includes the components of the switch transistors S1, S4 and S6.

Further, with the development of the package technology, the layout of the switching power converter is not limited to a planar configuration. For such a possible new package, for example, a layout of the chips in the switching power converter in a three dimensional configuration, the rule of layout optimization of the switching power converter of one embodiment of the present disclosure is still applicable. Specifically, all of the switch components except for the switch transistor S5 and the diode D5 are divided into four sets of SETA, SETB, SETC and SETD which are already been defined before. Since the principle of layout optimization is similar to the one applied in planar configuration, the principle of layout optimization of the switching power converter in three dimensions is not described by further illustration. The two or three dimensional layout optimization of the switching power converter obeys the same principle of layout optimization that ensures the commutation loops in consideration as short as possible.

With the above embodiments of the layout of the switching power converter of the present disclosure, the six-transistor topology of switching power converter may have smaller parasitic inductance of the commutation loop compared to layout of the switching power converter in the prior art, thereby the electrical characteristics of the switching power converter, i.e., efficiency of the switching power converter and reliability of the system, are improved.

Although the present disclosure has been described with reference to illustrative embodiments, it shall be understood that, terms used herein are merely illustrative, exemplary and non-limiting. Since the present disclosure may be embodied in many manners, it shall be understood that, the above embodiments are not limited to any details mentioned above, but shall be interpreted in a broad sense within the scope defined by the appended claims. Therefore, all the alterations and modifications falling in the scope of the claims and its equivalent shall be covered by the appended claims.

What is claimed is:

1. A layout of a power converter, wherein the power converter comprises:
    six power transistor units, comprising: a first power transistor unit, a second power transistor unit, a third power transistor unit, a fourth power transistor unit, a fifth power transistor unit and a sixth power transistor unit, wherein the first power transistor unit and the second power transistor unit are connected in series to form a first bridge arm, the third power transistor unit, the sixth power transistor unit and the fourth power transistor unit are connected sequentially in series to form a second bridge arm, the first bridge arm and the second bridge arm are connected in parallel, a common node of the first power transistor unit and the second power transistor unit is a midpoint of the first bridge arm, an end of the fifth power transistor unit is connected to the midpoint of the first bridge arm, and another end of the fifth power transistor unit is connected to a common node of the third power transistor unit and the sixth power transistor unit;
    a capacitor unit, wherein an end of the capacitor unit is connected to a common node of the first power transistor unit and the third power transistor unit, and another end of the capacitor unit is connected to a common node of the second power transistor unit and the fourth power transistor unit; and
    a carrier board, wherein a surface of the carrier board carries the six power transistor units and the capacitor unit and the carrier board provides electrical connections between the six power transistor units and the capacitor unit, and edges of the carrier board are provided with pins for the power converter to be electrically connected to outside,
    wherein a first commutation circuit is a loop formed by the capacitor unit, the first power transistor unit, the fifth power transistor unit, the sixth power transistor unit, the fourth power transistor unit sequentially connected in series, a second commutation circuit is another loop formed by the capacitor unit, the second power transistor unit, the fifth power transistor unit and the third power transistor unit sequentially connected in series, and
    wherein the fifth power transistor unit is located at a middle position of the surface of the carrier board, and a connection line segment from the fourth power transistor unit to the first power transistor unit and a connection line segment from the fourth power transistor unit to the sixth power transistor unit do not overlap with a connection line segment from the second power transistor unit to the third power transistor unit, such that the first and second commutation circuits in the power converter are shortened, thus parasitic inductances of the first and second commutation circuits are reduced.

2. The layout according to claim 1, wherein the capacitor unit comprises a first capacitor and a second capacitor, the first capacitor is located close to the second power transistor unit and the third power transistor unit, and the second capacitor is located close to the first power transistor unit and the fourth power transistor unit.

3. The layout according to claim 1, wherein the first power transistor unit is constituted by a first power transistor and a first diode in antiparallel, the second power transistor unit is constituted by a second power transistor and a second diode in antiparallel, the third power transistor unit is constituted by a third power transistor and a third diode in antiparallel, the fourth power transistor unit is constituted by a fourth power transistor and a fourth diode in antiparallel, the fifth power transistor unit is constituted by a fifth power transistor and a fifth diode in antiparallel, and the sixth power transistor unit is constituted by a sixth power transistor and a sixth diode in antiparallel.

4. The layout according to claim 3, wherein the power converter is an inverter, the second power transistor and the third power transistor are grouped as components in a first set, the first power transistor, the fourth power transistor and the sixth diode are grouped as components in a second set, wherein the components in the first set are close to each other, the components in the second set are close to each other, and the components in the first set and the components in the second set are respectively close to the fifth power transistor and the fifth diode.

5. The layout according to claim 4, wherein a connection line segment between a gravity center of the second power transistor and a gravity center of the third power transistor does not overlap with a connection line segment between a gravity center of the fourth power transistor and a gravity center of the first power transistor and a connection line segment between the gravity center of the fourth power transistor and a gravity center of the sixth diode.

6. The layout according to claim 4, wherein the power converter is of approximately 3 kW or 5 kW, a connection line segment between a gravity center of the second power transistor and a gravity center of the third power transistor has a first length, a sum of a length of a connection line segment between a gravity center of the fourth power transistor and a gravity center of the first power transistor and a length of a connection line segment between a gravity center of the fourth power transistor and a gravity center of the sixth diode is a second length, and a sum of the first length and the second length is not greater than 60 mm.

7. The layout according to claim 6, wherein the sum of the first length and the second length is not greater than 44.6 mm.

8. The layout according to claim 3, wherein the power converter is a rectifier, the second diode and the third diode are grouped as components in a third set, the first diode, the fourth diode and the sixth power transistor are grouped as components in a fourth set, wherein the components in the third set are close to each other, the components in the fourth set are close to each other, and the components in the third set and the components in the fourth set are respectively close to the fifth power transistor and the fifth diode.

9. The layout according to claim 8, wherein a connection line segment between a gravity center of the second diode and a gravity center of the third diode does not overlap with a connection line segment between a gravity center of the fourth diode and a gravity center of the first diode and a connection line segment between the gravity center of the fourth diode and a gravity center of the sixth power transistor.

10. The layout according to claim 8, wherein the power converter is of approximately 3 kW or 5 kW, a connection line segment between a gravity center of the second diode and a gravity center of the third diode has a third length, a sum of a length of a connection line segment between a gravity center of the fourth diode and a gravity center of the first diode and a length of a connection line segment between a gravity center of the fourth diode and a gravity center of the sixth power transistor is a fourth length, and a sum of the third length and the fourth length is not greater than 60 mm.

11. The layout according to claim 10, wherein the sum of the third length and the fourth length is not greater than 46.48 mm.

12. A layout of a power converter, wherein the power converter comprises:
six power transistor units, comprising: a first power transistor unit, a second power transistor unit, a third power transistor unit, a fourth power transistor unit, a fifth power transistor unit and a sixth power transistor unit, wherein the first power transistor unit and the second power transistor unit are connected in series to form a first bridge arm, the third power transistor unit, the sixth power transistor unit and the fourth power transistor unit are connected sequentially in series to form a second bridge arm, the first bridge arm and the second bridge arm are connected in parallel, a common node of the first power transistor unit and the second power transistor unit is a midpoint of the first bridge arm, an end of the fifth power transistor unit is connected to the midpoint of the first bridge arm, and another end of the fifth power transistor unit is connected to a common node of the third power transistor unit and the sixth power transistor unit;
a capacitor unit, wherein an end of the capacitor unit is connected to a common node of the first power transistor unit and the third power transistor unit, and another end of the capacitor unit is connected to a common node of the second power transistor unit and the fourth power transistor unit; and
a carrier board, wherein a surface of the carrier board carries the six power transistor units and the capacitor unit and the carrier board provides electrical connections between the six power transistor units and the capacitor unit, and edges of the carrier board is provided with pins for the power converter to be electrically connected to outside,
wherein a first commutation circuit is a loop formed by the capacitor unit, the first power transistor unit, the fifth power transistor unit, the sixth power transistor unit and the fourth power transistor unit sequentially connected in series, a second commutation circuit is another loop formed by the capacitor unit, the second power transistor unit, the fifth power transistor unit and the third power transistor unit sequentially connected in series, and wherein the fifth power transistor unit is located at a middle position of the surface of the carrier board, and a sum of a length of a connection line segment from the fourth power transistor unit to the first power transistor unit, a length of a connection line segment from the fourth power transistor unit to the sixth power transistor unit and a length of a connection line segment between the second power transistor unit and the third power transistor unit is less than or equal to 66 mm, such that the first and second commutation circuits in the power converter are shortened, thus parasitic inductances of the first and second commutation circuits are reduced.

13. The layout according to claim 12, wherein
the capacitor unit comprises a first capacitor and a second capacitor, the first capacitor is located close to the second power transistor unit and the third power transistor unit, and the second capacitor is located close to the first power transistor unit and the fourth power transistor unit.

14. The layout according to claim 12, wherein
the first power transistor unit is constituted by a first power transistor and a first diode in antiparallel, the second power transistor unit is constituted by a second power transistor and a second diode in antiparallel, the third power transistor unit is constituted by a third power transistor and a third diode in antiparallel, the fourth power transistor unit is constituted by a fourth power transistor and a fourth diode in antiparallel, the fifth power transistor unit is constituted by a fifth power transistor and a fifth diode in antiparallel, and the sixth power transistor unit is constituted by a sixth power transistor and a sixth diode in antiparallel.

15. The layout according to claim 14, wherein
the power converter is an inverter, the second power transistor and the third power transistor are grouped as components in a first set, the first power transistor, the fourth power transistor and the sixth diode are grouped as components in a second set, wherein the components in the first set are close to each other, the components in the second set are close to each other, and the components in the first set and the components in the second set are respectively close to the fifth power transistor and the fifth diode.

16. The layout according to claim 15, wherein
a connection line segment between a gravity center of the second power transistor and a gravity center of the third power transistor overlaps with a connection line segment between a gravity center of the fourth power transistor and a gravity center of the first power transistor or a connection line segment between the gravity center of the fourth power transistor and a gravity center of the sixth diode.

17. The layout according to claim 14, wherein
the power converter is a rectifier, the second diode and the third diode are grouped as components in a third set, the first diode, the fourth diode and the sixth power transistor are grouped as components in a fourth set, wherein the components in the third set are close to each other, the components in the fourth set are close to each other, and the components in the third set and the components in the fourth set are respectively close to the fifth power transistor and the fifth diode.

18. The layout according to claim 17, wherein
a connection line segment between a gravity center of the second diode and a gravity center of the third diode overlaps with a connection line segment between a gravity center of the fourth diode and a gravity center of the first diode or a connection line segment between the gravity center of the fourth diode and a gravity center of the sixth power transistor.

* * * * *